(12) United States Patent
In

(10) Patent No.: US 12,094,394 B2
(45) Date of Patent: Sep. 17, 2024

(54) GATE DRIVER AND DISPLAY APPARATUS INCLUDING THE SAME

(71) Applicant: Samsung Display Co., Ltd., Yongin-Si (KR)

(72) Inventor: Hai-Jung In, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/084,591

(22) Filed: Dec. 20, 2022

(65) Prior Publication Data
US 2023/0351941 A1 Nov. 2, 2023

(30) Foreign Application Priority Data
Apr. 28, 2022 (KR) .......................... 10-2022-0052979

(51) Int. Cl.
*G09G 3/20* (2006.01)
*G11C 19/28* (2006.01)

(52) U.S. Cl.
CPC ... *G09G 3/2096* (2013.01); *G09G 2310/0275* (2013.01); *G09G 2310/0286* (2013.01); *G09G 2310/0291* (2013.01); *G09G 2310/08* (2013.01); *G11C 19/28* (2013.01)

(58) Field of Classification Search
CPC ......... G09G 3/2096; G09G 2310/0275; G09G 2310/0286; G09G 2310/0291; G09G 2310/08; G11C 19/28
See application file for complete search history.

(56) References Cited

U.S. PATENT DOCUMENTS

| 9,886,891 | B2 | 2/2018 | In et al. | |
|---|---|---|---|---|
| 10,453,386 | B2 | 10/2019 | Jang | |
| 2010/0188316 | A1* | 7/2010 | Jang | H05B 45/60 345/76 |
| 2012/0038616 | A1* | 2/2012 | Song | G09G 3/003 345/212 |
| 2017/0294165 | A1* | 10/2017 | Park | G09G 3/3266 |

* cited by examiner

*Primary Examiner* — Towfiq Elahi
(74) *Attorney, Agent, or Firm* — Innovation Counsel LLP

(57) ABSTRACT

A gate driver includes a carry signal generating circuit and a shift register circuit. The carry signal generating circuit receives a vertical start signal and outputs first and second carry signals. The shift register circuit receives the first and second carry signals and outputs a first stage first carry signal, a first stage second carry signal and a first stage gate output signal. The carry signal generating circuit includes a first carry generator generating the first carry signal and a second carry generator generating the second carry signal. The shift register circuit includes a first stage first carry generator generating the first stage first carry signal, a first stage second carry generator generating the first stage second carry signal and a first stage output buffer outputting the first stage gate output signal.

24 Claims, 14 Drawing Sheets

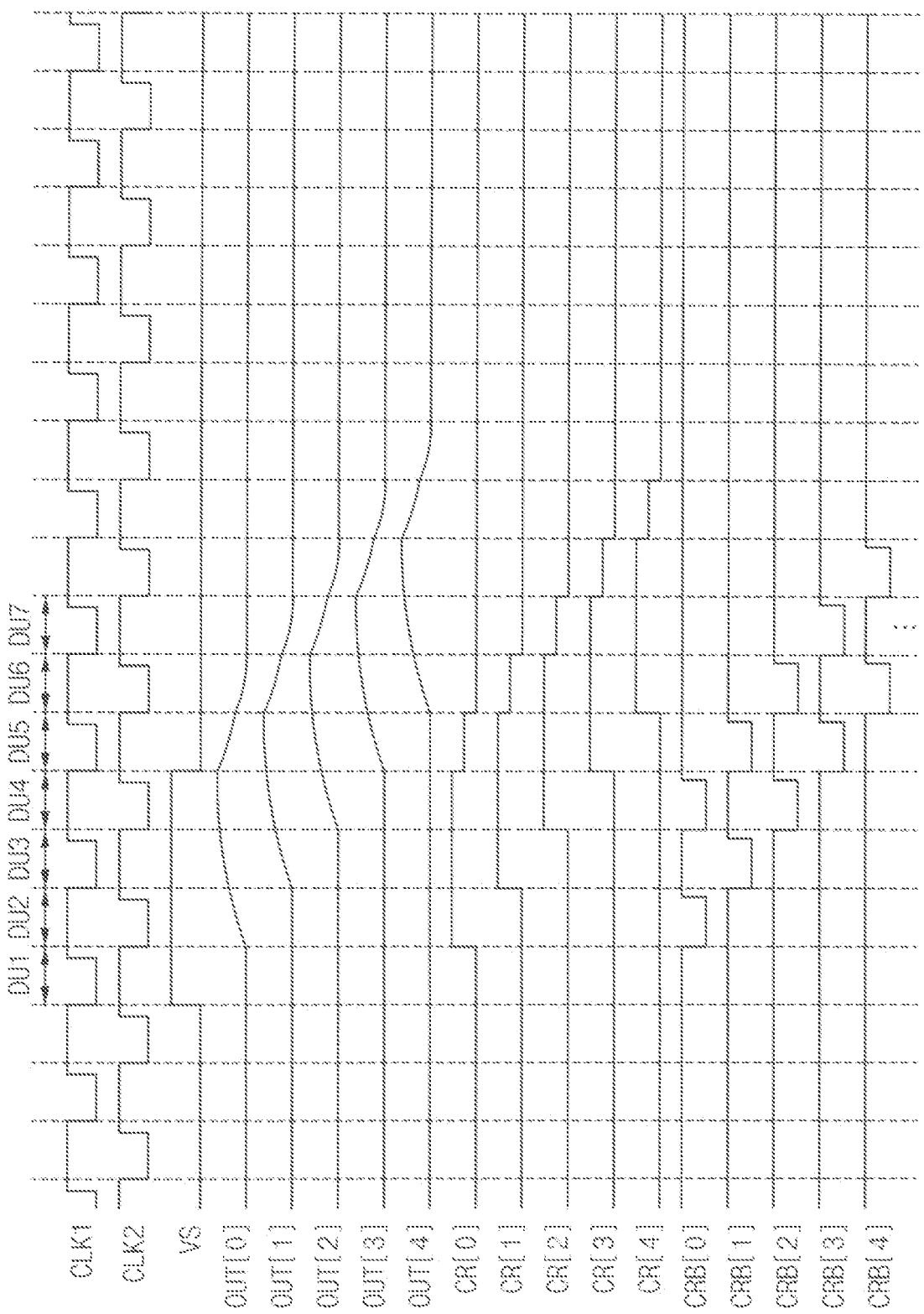

GATE DRIVER AND DISPLAY APPARATUS INCLUDING THE SAME

PRIORITY STATEMENT

This application claims priority under 35 U.S.C. § 119 to Korean Patent Application No. 10-2022-0052979, filed on Apr. 28, 2022, in the Korean Intellectual Property Office KIPO, the contents of which are herein incorporated by reference in their entireties.

BACKGROUND

1. Field

Embodiments of the present inventive concept relate to a gate driver and a display apparatus including the gate driver. More particularly, embodiments of the present inventive concept relate to a gate driver stably outputting a gate signal and a display apparatus including the gate driver.

2. Description of the Related Art

Generally, a display apparatus includes a display panel and a display panel driver. The display panel includes a plurality of gate lines, a plurality of data lines, a plurality of emission lines and a plurality of pixels. The display panel driver includes a gate driver, a data driver, an emission driver and a driving controller. The gate driver outputs gate signals to the gate lines. The data driver outputs data voltages to the data lines. The emission driver outputs emission signals to the emission lines. The driving controller controls the gate driver, the data driver and the emission driver.

Recently, a size of the display panel is increasing, a resolution of the display panel is increasing and a driving speed of the display panel is increasing. Accordingly, a load of the gate line may increase due to an increase of the number of pixels to be driven by the gate driver, an increase of a length of the gate line and an increase of parasitic capacitance of the gate line. In addition, a frequency of a clock signal applied to the gate driver may also be increased. Due to the high-speed driving and the increase of the load, a waveform of an output signal of the gate driver may be broken. Thus, a stability and a reliability of the gate driver may be reduced.

In addition, a display quality of the display panel may be deteriorated due to the broken waveform of the output signal of the gate driver.

SUMMARY

Embodiments of the present inventive concept provide a gate driver capable of stably outputting a gate signal.

Embodiments of the present inventive concept provide a display apparatus including the gate driver.

In an embodiment of a gate driver according to the present inventive concept, the gate driver includes a carry signal generating circuit and a shift register circuit. The carry signal generating circuit is configured to receive a vertical start signal and output a first carry signal and a second carry signal. The shift register circuit is configured to receive the first carry signal and the second carry signal and output a first stage first carry signal, a first stage second carry signal and a first stage gate output signal. The carry signal generating circuit includes a first carry generator configured to generate the first carry signal and a second carry generator configured to generate the second carry signal. The shift register circuit includes a first stage first carry generator configured to generate the first stage first carry signal, a first stage second carry generator configured to generate the first stage second carry signal and a first stage output buffer configured to output the first stage gate output signal.

In an embodiment, a connection between transistors of the carry signal generating circuit may be different from a connection between transistors of the shift register circuit.

In an embodiment, the carry signal generating circuit may further include an output buffer including a ninth transistor including a control electrode connected to a QB node, an input electrode configured to receive a high power voltage and an output electrode connected to an output terminal and a tenth transistor including a control electrode connected to a Q1 node, an input electrode configured to receive a low power voltage and an output electrode connected to the output terminal.

In an embodiment, the first carry generator may include a fourteenth transistor including a control electrode connected to the QB node, an input electrode configured to receive the high power voltage and an output electrode connected to a first carry output terminal and a fifteenth transistor including a control electrode connected to the Q1 node, an input electrode configured to receive the low power voltage and an output electrode connected to the first carry output terminal.

In an embodiment, the second carry generator may include a seventh transistor including a control electrode connected to a third node, an input electrode configured to receive a second clock signal and an output electrode connected to a second carry output terminal, an eleventh transistor including a control electrode configured to receive a low power voltage, an input electrode connected to a first node and an output electrode connected to the third node and a second capacitor including a first end connected to the third node and a second end connected to the second carry output terminal.

In an embodiment, the carry signal generating circuit may further include a first transistor including a control electrode configured to receive a first clock signal, an input electrode configured to receive the vertical start signal and an output electrode connected to a Q2 node, a second transistor including a control electrode connected to a first node, an input electrode configured to receive a high power voltage and an output electrode connected to a second node, a third transistor including a control electrode connected to a Q1 node, an input electrode configured to receive a second clock signal and an output electrode connected to the second node, a fourth transistor including a control electrode connected to the Q2 node, an input electrode configured to receive the first clock signal and an output electrode connected to the first node, a fifth transistor including a control electrode configured to receive the first clock signal, an input electrode configured to receive a low power voltage and an output electrode connected to the first node and a third capacitor including a first end connected to the Q1 node and a second end connected to the second node.

In an embodiment, the carry signal generating circuit may further include a sixth transistor including a control electrode configured to receive the second clock signal, an input electrode connected to a QB node and an output electrode connected to a second carry output terminal, an eighth transistor including a control electrode connected to the Q2 node, an input electrode configured to receive the high power voltage and an output electrode connected to the QB node and a first capacitor including a first end configured to receive the high power voltage and a second end connected to the QB node.

In an embodiment, the carry signal generating circuit may further include a twelfth transistor including a control electrode configured to receive the low power voltage, an input electrode connected to the Q2 node and an output electrode connected to the Q1 node.

In an embodiment, the carry signal generating circuit may further include a thirteenth transistor including a control electrode configured to receive a reset signal, an input electrode configured to receive the high power voltage and an output electrode connected to the Q2 node.

In an embodiment, the carry signal generating circuit may further include a seventeenth transistor including a control electrode configured to receive a first clock signal, an input electrode configured to receive the vertical start signal and an output electrode connected to a fourth node and an eighteenth transistor including a control electrode configured to receive a low power voltage, an input electrode connected to the fourth node and an output electrode connected to a fifth node.

In an embodiment, the carry signal generating circuit may further include a nineteenth transistor including a control electrode connected to the fifth node, an input electrode connected to the fifth node and an output electrode connected to a Q1 node.

In an embodiment, the carry signal generating circuit may further include a first transistor including a control electrode configured to receive a first clock signal, an input electrode configured to receive the vertical start signal and an output electrode connected to a Q2 node, a second transistor including a control electrode connected to a first node, an input electrode configured to receive a high power voltage and an output electrode connected to a second node, a third transistor including a control electrode configured to receive a second clock signal, an input electrode connected to the second node and an output electrode connected to the Q2 node, a fourth transistor including a control electrode connected to the Q2 node, an input electrode configured to receive the first clock signal and an output electrode connected to the first node and a fifth transistor including a control electrode configured to receive the first clock signal, an input electrode configured to receive a low power voltage and an output electrode connected to the first node.

In an embodiment, the carry signal generating circuit may further include a sixth transistor including a control electrode configured to receive the second clock signal, an input electrode connected to a QB node and an output electrode connected to a second carry output terminal, an eighth transistor including a control electrode connected to the Q2 node, an input electrode configured to receive the high power voltage and an output electrode connected to the QB node, a first capacitor including a first end configured to receive the high power voltage and a second end connected to the QB node and a fourth capacitor including a first end configured to receive the second clock signal and a second end connected to the Q1 node.

In an embodiment, the first stage output buffer may include a ninth transistor including a control electrode connected to a QB node, an input electrode configured to receive a high power voltage and an output electrode connected to a first stage output terminal and a tenth transistor including a control electrode connected to a Q1 node, an input electrode configured to receive a low power voltage and an output electrode connected to the first stage output terminal.

In an embodiment, the first stage first carry generator may include a fourteenth transistor including a control electrode connected to the QB node, an input electrode configured to receive the high power voltage and an output electrode connected to a first stage first carry output terminal and a fifteenth transistor including a control electrode connected to the Q1 node, an input electrode configured to receive the low power voltage and an output electrode connected to the first stage first carry output terminal.

In an embodiment, the first stage second carry generator may include a seventh transistor including a control electrode connected to a third node, an input electrode configured to receive a second clock signal and an output electrode connected to a first stage second carry output terminal, an eleventh transistor including a control electrode configured to receive a low power voltage, an input electrode connected to a first node and an output electrode connected to the third node and a second capacitor including a first end connected to the third node and a second end connected to the first stage second carry output terminal.

In an embodiment, the shift register circuit may further include a first transistor including a control electrode configured to receive a first clock signal, an input electrode configured to receive the first carry signal and an output electrode connected to a Q2 node, a second transistor including a control electrode connected to a first node, an input electrode configured to receive a high power voltage and an output electrode connected to a second node, a third transistor including a control electrode connected to a Q1 node, an input electrode configured to receive a second clock signal and an output electrode connected to the second node, a fourth transistor including a control electrode configured to receive the first clock signal, an input electrode configured to receive the second carry signal and an output electrode connected to the first node and a third capacitor including a first end connected to the Q1 node and a second end connected to the second node.

In an embodiment, the shift register circuit may further include a sixth transistor including a control electrode configured to receive the second clock signal, an input electrode connected to a QB node and an output electrode connected to a first stage second carry output terminal, an eighth transistor including a control electrode connected to the Q2 node, an input electrode configured to receive the high power voltage and an output electrode connected to the QB node and a first capacitor including a first end configured to receive the high power voltage and a second end connected to the QB node.

In an embodiment, the shift register circuit may further include a twelfth transistor including a control electrode configured to receive the low power voltage, an input electrode connected to the Q2 node and an output electrode connected to the Q1 node.

In an embodiment, the shift register circuit may further include a thirteenth transistor including a control electrode configured to receive a reset signal, an input electrode configured to receive the high power voltage and an output electrode connected to the Q2 node and a sixteenth transistor including a control electrode configured to receive the reset signal, an input electrode configured to receive the reset signal and an output electrode connected to the QB node.

In an embodiment, the shift register circuit may further include a seventeenth transistor including a control electrode configured to receive a first clock signal, an input electrode configured to receive the first carry signal and an output electrode connected to a fourth node and an eighteenth transistor including a control electrode configured to receive a low power voltage, an input electrode connected to the fourth node and an output electrode connected to a fifth node.

In an embodiment, the shift register circuit may further include a nineteenth transistor including a control electrode connected to the fifth node, an input electrode connected to the fifth node and an output electrode connected to a Q1 node.

In an embodiment, the shift register circuit may further include a first transistor including a control electrode configured to receive a first clock signal, an input electrode configured to receive the first carry signal and an output electrode connected to a Q2 node, a second transistor including a control electrode connected to a first node, an input electrode configured to receive a high power voltage and an output electrode connected to a second node, a third transistor including a control electrode configured to receive a second clock signal, an input electrode connected to the second node and an output electrode connected to the Q2 node and a fourth transistor including a control electrode configured to receive the first clock signal, an input electrode configured to receive the second carry signal and an output electrode connected to the first node.

In an embodiment, the shift register circuit may further include a sixth transistor including a control electrode configured to receive the second clock signal, an input electrode connected to a QB node and an output electrode connected to a first stage second carry output terminal, an eighth transistor including a control electrode connected to the Q2 node, an input electrode configured to receive the high power voltage and an output electrode connected to the QB node, a first capacitor including a first end configured to receive the high power voltage and a second end connected to the QB node and a fourth capacitor including a first end receiving the second clock signal and a second end connected to the Q1 node.

In an embodiment of a display apparatus according to the present inventive concept, the display apparatus includes a display panel including a pixel, a gate driver configured to provide a gate signal to the pixel, a data driver configured to provide a data voltage to the pixel and an emission driver configured to provide an emission signal to the pixel. The gate driver includes a carry signal generating circuit and a shift register circuit. The carry signal generating circuit is configured to receive a vertical start signal and output a first carry signal and a second carry signal. The shift register circuit is configured to receive the first carry signal and the second carry signal and output a first stage first carry signal, a first stage second carry signal and a first stage gate output signal. The carry signal generating circuit includes a first carry generator configured to generate the first carry signal and a second carry generator configured to generate the second carry signal. The shift register circuit includes a first stage first carry generator configured to generate the first stage first carry signal, a first stage second carry generator configured to generate the first stage second carry signal and a first stage output buffer configured to output the first stage gate output signal.

According to the gate driver and the display apparatus including the gate driver, the gate driver includes the carry signal generating circuit including the first carry generator and the second carry generator and the shift register circuit including the output buffer, the first carry generator and the second carry generator. The shift register circuit operates based on the first carry signal and the second carry signal generated by the carry signal generating circuit so that the gate driver may stably output the gate signal.

Thus, the stability and the reliability of the gate driver may be enhanced and the display quality of the display panel may be enhanced.

BRIEF DESCRIPTION OF THE DRAWINGS

The above and other features and advantages of the inventive concept will become more apparent by describing in detailed embodiments thereof with reference to the accompanying drawings, in which:

FIG. 7B is a timing diagram illustrating input signals and output signals of the gate driver of FIG. 3;

DETAILED DESCRIPTION OF THE INVENTIVE CONCEPT

Hereinafter, the present inventive concept will be explained in detail with reference to the accompanying drawings.

Figure 1:
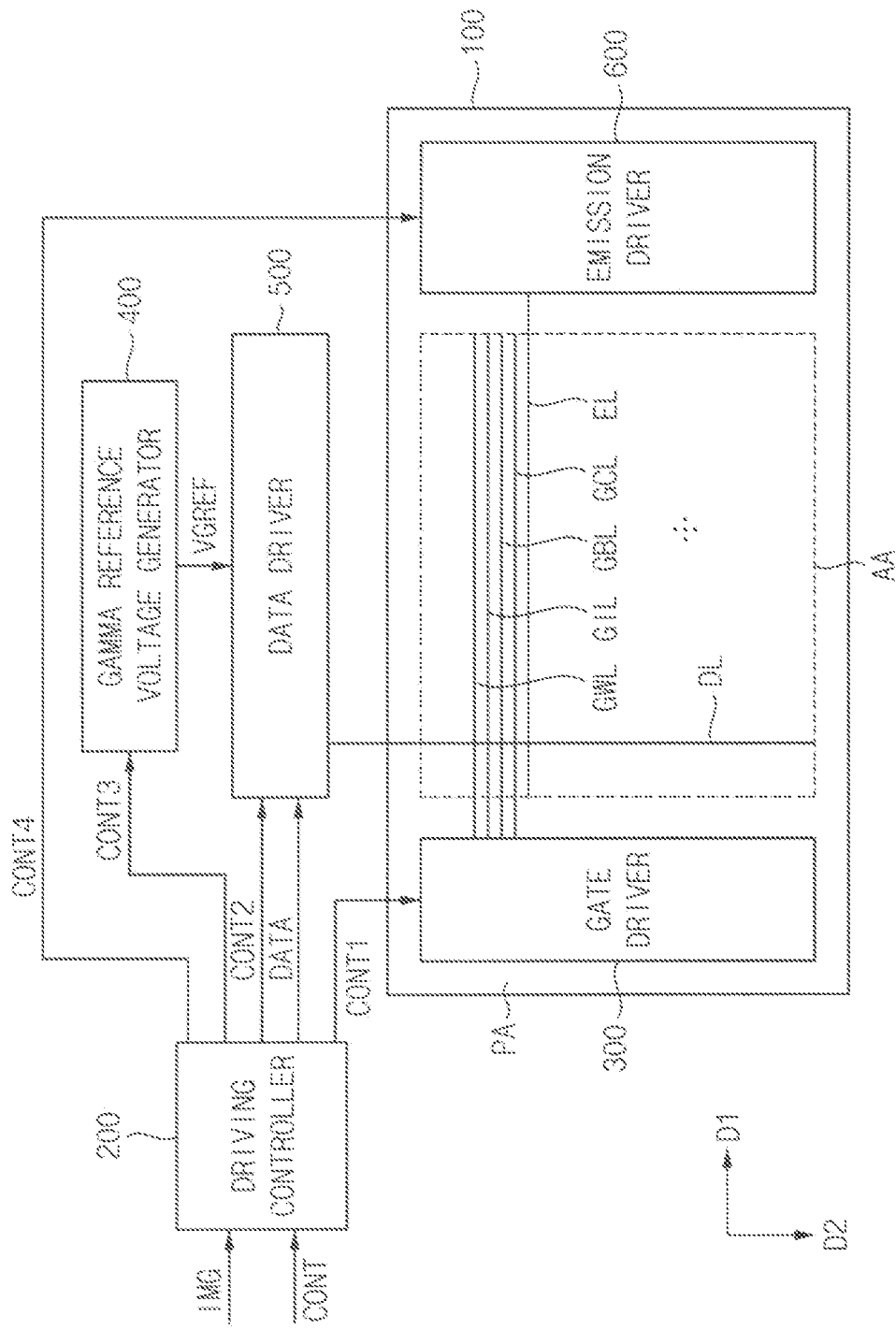
FIG. 1 is a block diagram illustrating a display apparatus according to an embodiment of the present inventive concept.

FIG. 1 is a block diagram illustrating a display apparatus according to an embodiment of the present inventive concept.

Referring to FIG. 1, the display apparatus includes a display panel 100 and a display panel driver. The display panel driver includes a driving controller 200, a gate driver 300, a gamma reference voltage generator 400, a data driver 500 and an emission driver 600.

The display panel 100 has a display region AA on which an image is displayed and a peripheral region PA disposed adjacent to the display region AA.

The display panel 100 includes a plurality of gate lines GWL, GIL, GBL and GCL, a plurality of data lines DL, a plurality of emission lines EL and a plurality of pixels electrically connected to the gate lines GWL, GIL, GBL and GCL, the data lines DL and the emission lines EL. The gate lines GWL, GIL, GBL and GCL may extend in a first direction D1, the data lines DL may extend in a second direction D2 crossing the first direction D1 and the emission lines EL may extend in the first direction D1.

The driving controller 200 receives input image data IMG and an input control signal CONT from an external apparatus. For example, the input image data IMG may include red image data, green image data and blue image data. The input image data IMG may include white image data. The input image data IMG may include magenta image data, cyan image data and yellow image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3, a fourth control signal CONT4 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500.

The driving controller 200 generates the third control signal CONT3 for controlling an operation of the gamma reference voltage generator 400 based on the input control signal CONT, and outputs the third control signal CONT3 to the gamma reference voltage generator 400.

The driving controller 200 generates the fourth control signal CONT4 for controlling an operation of the emission driver 600 based on the input control signal CONT, and outputs the fourth control signal CONT4 to the emission driver 600.

The gate driver 300 generates gate signals driving the gate lines GWL, GIL, GBL and GCL in response to the first control signal CONT1 received from the driving controller 200. The gate driver 300 may output the gate signals to the gate lines GWL, GIL, GBL and GCL. For example, the gate driver 300 may be integrated on the peripheral region PA of the display panel 100. For example, the gate driver 300 may be mounted on the peripheral region PA of the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

In an embodiment, the gamma reference voltage generator 400 may be embedded in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The emission driver 600 generates emission signals to drive the emission lines EL in response to the fourth control signal CONT4 received from the driving controller 200. The emission driver 600 may output the emission signals to the emission lines EL. For example, the emission driver 600 may be integrated on the peripheral region PA of the display panel 100. For example, the emission driver 600 may be mounted on the peripheral region PA of the display panel 100.

Although the gate driver 300 is disposed at a first side of the display panel 100 and the emission driver 600 is disposed at a second side of the display panel 100 opposite to the first side in FIG. 1 for convenience of explanation, the present inventive concept may not be limited thereto. For example, both of the gate driver 300 and the emission driver 600 may be disposed at the first side of the display panel 100. For example, the gate driver 300 and the emission driver 600 may be integrally formed.

Figure 2:
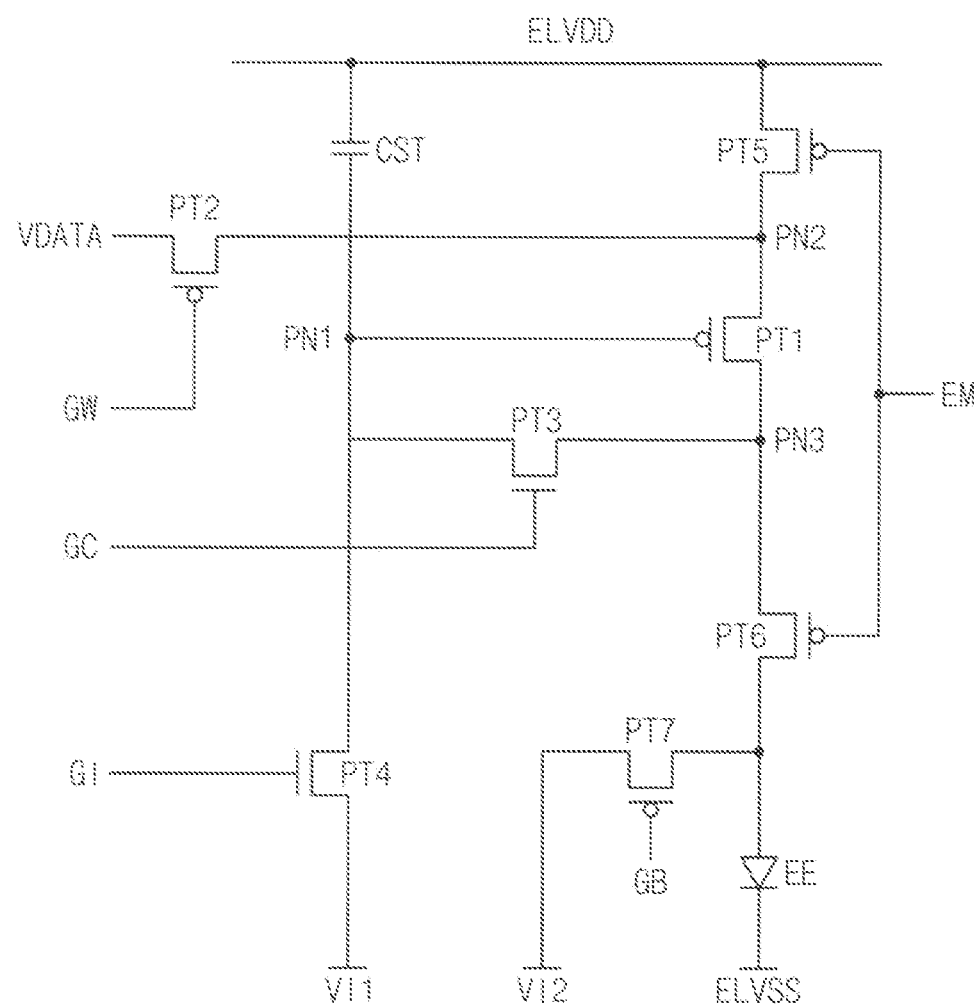
FIG. 2 is a circuit diagram illustrating a pixel of a display panel of FIG. 1.

FIG. 2 is a circuit diagram illustrating a pixel of the display panel 100 of FIG. 1.

Referring to FIGS. 1 and 2, the display panel 100 includes the plurality of the pixels. Each pixel includes a light emitting element EE.

The pixel receives a data writing gate signal GW, a compensation gate signal GC, a data initialization gate signal GI, a light emitting element initialization gate signal GB, the data voltage VDATA and the emission signal EM. The light emitting element EE of the pixel emits light corresponding to the level of the data voltage VDATA to display the image.

In the present embodiment, the pixel may include a switching element of a first type and a switching element of a second type different from the first type. For example, the switching element of the first type may be a polysilicon thin film transistor. For example, the switching element of the first type may be a low temperature polysilicon (LTPS) thin film transistor. For example, the switching element of the second type may be an oxide thin film transistor. For example, the switching element of the first type may be a P-type transistor and the switching element of the second type may be an N-type transistor.

For example, the pixel may include first, second, third, fourth, fifth, sixth and seventh pixel switching elements PT1, PT2, PT3, PT4, PT5, PT6 and PT7, a storage capacitor CST and the light emitting element EE.

The first pixel switching element PT1 includes a control electrode connected to a first node PN1, an input electrode connected to a second node PN2 and an output electrode connected to a third node PN3.

For example, the first pixel switching element PT1 may be the polysilicon thin film transistor. For example, the first pixel switching element PT1 may be the P-type thin film transistor. The control electrode of the first pixel switching element PT1 may be a gate electrode, the input electrode of the first pixel switching element PT1 may be a source electrode and the output electrode of the first pixel switching element PT1 may be a drain electrode.

The second pixel switching element PT2 includes a control electrode receiving the data writing gate signal GW, an input electrode receiving the data voltage VDATA and an output electrode connected to the second node PN2.

For example, the second pixel switching element PT2 may be the polysilicon thin film transistor. For example, the second pixel switching element PT2 may be the P-type thin film transistor. The control electrode of the second pixel switching element PT2 may be a gate electrode, the input electrode of the second pixel switching element PT2 may be a source electrode and the output electrode of the second pixel switching element PT2 may be a drain electrode.

The third pixel switching element PT3 includes a control electrode receiving the compensation gate signal GC, an input electrode connected to the first node PN1 and an output electrode connected to the third node PN3.

For example, the third pixel switching element PT3 may be the oxide thin film transistor. For example, the third pixel switching element PT3 may be the N-type thin film transistor. The control electrode of the third pixel switching element PT3 may be a gate electrode, the input electrode of the third pixel switching element PT3 may be a source electrode and the output electrode of the third pixel switching element PT3 may be a drain electrode.

The fourth pixel switching element PT4 includes a control electrode receiving the data initialization gate signal GI, an input electrode receiving an initialization voltage VI1 and an output electrode connected to the first node PN1.

For example, the fourth pixel switching element PT4 may be the oxide thin film transistor. For example, the fourth pixel switching element PT4 may be the N-type thin film transistor. The control electrode of the fourth pixel switching element PT4 may be a gate electrode, the input electrode of the fourth pixel switching element PT4 may be a source electrode and the output electrode of the fourth pixel switching element PT4 may be a drain electrode.

The fifth pixel switching element PT5 includes a control electrode receiving the emission signal EM, an input electrode receiving a first power voltage ELVDD and an output electrode connected to the second node PN2.

For example, the fifth pixel switching element PT5 may be the polysilicon thin film transistor. For example, the fifth pixel switching element PT5 may be the P-type thin film transistor. The control electrode of the fifth pixel switching element PT5 may be a gate electrode, the input electrode of the fifth pixel switching element PT5 may be a source electrode and the output electrode of the fifth pixel switching element PT5 may be a drain electrode.

The sixth pixel switching element PT6 includes a control electrode receiving the emission signal EM, an input electrode connected to the third node PN3 and an output electrode connected to an anode electrode of the light emitting element EE.

For example, the sixth pixel switching element PT6 may be the polysilicon thin film transistor. For example, the sixth pixel switching element PT6 may be the P-type thin film transistor. The control electrode of the sixth pixel switching element PT6 may be a gate electrode, the input electrode of the sixth pixel switching element PT6 may be a source electrode and the output electrode of the sixth pixel switching element PT6 may be a drain electrode.

The seventh pixel switching element PT7 includes a control electrode receiving the light emitting element initialization gate signal GB, an input electrode receiving a second initialization voltage VI2 and an output electrode connected to the anode electrode of the light emitting element EE. Although the second initialization voltage VI2 is applied to the input electrode of the seventh pixel switching element PT7 in the present embodiment, the present inventive concept may not be limited thereto. In an embodiment, the initialization voltage VI1 may be applied to the input electrode of the seventh pixel switching element PT7.

For example, the seventh pixel switching element PT7 may be the polysilicon thin film transistor. For example, the seventh pixel switching element PT7 may be the P-type thin film transistor. The control electrode of the seventh pixel switching element PT7 may be a gate electrode, the input electrode of the seventh pixel switching element PT7 may be a source electrode and the output electrode of the seventh pixel switching element PT7 may be a drain electrode.

The storage capacitor CST includes a first electrode receiving the first power voltage ELVDD and a second electrode connected to the first node PN1.

The light emitting element EE includes the anode electrode and a cathode electrode receiving a second power voltage ELVSS.

Figure 3:
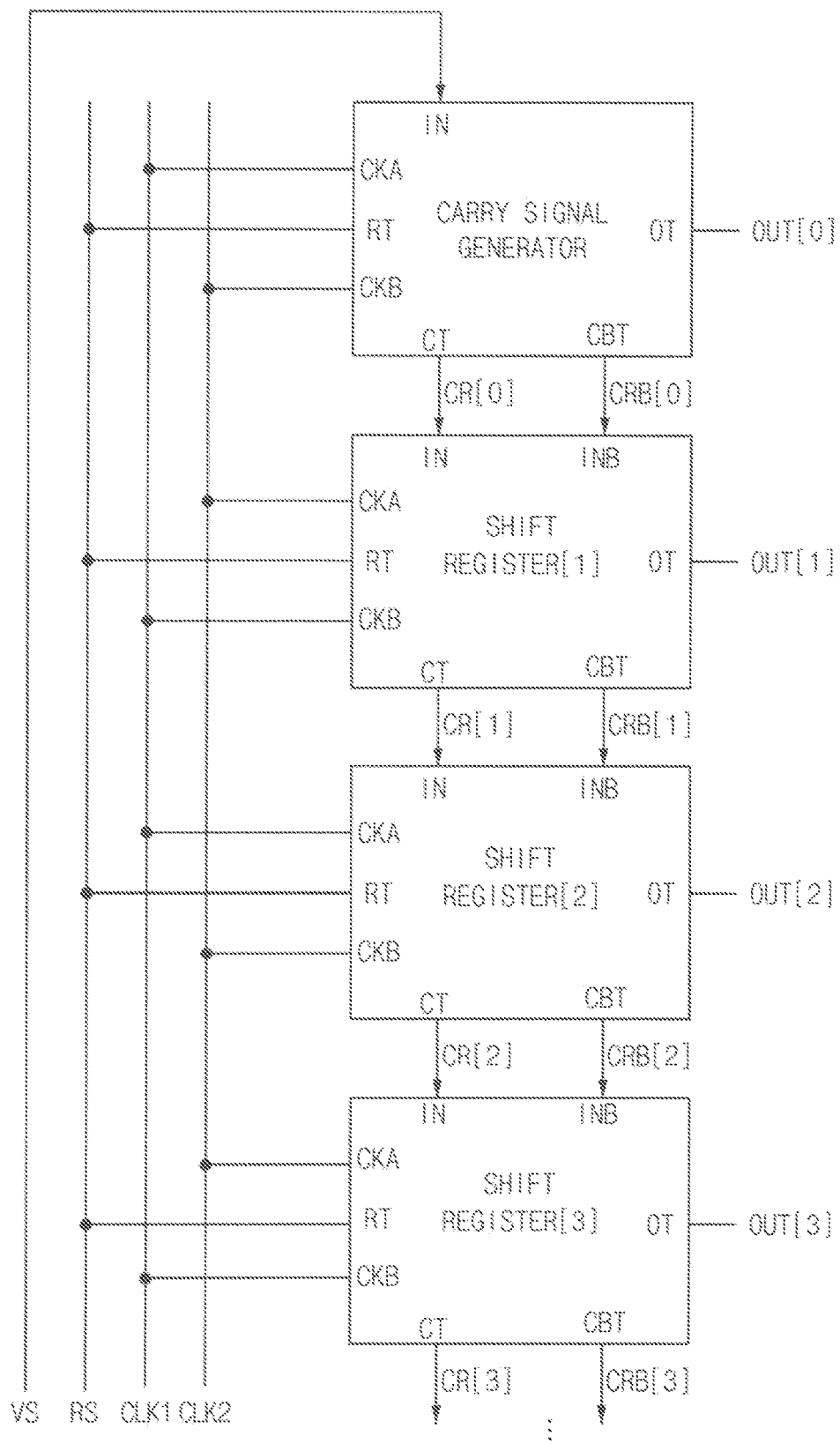
FIG. 3 is a block diagram illustrating a gate driver of FIG. 1.

FIG. 3 is a block diagram illustrating the gate driver 300 of FIG. 1.

Referring to FIGS. 1 to 3, in the present embodiment, the gate driver 300 includes a carry signal generating circuit CARRY SIGNAL GENERATOR and a plurality of shift register circuits SHIFT REGISTER[1], SHIFT REGISTER[2], SHIFT REGISTER[3], . . . .

The carry signal generating circuit CARRY SIGNAL GENERATOR may include a first input terminal IN, a first clock terminal CKA, a second clock terminal CKB, a reset terminal RT, an output terminal OT, a first carry output terminal CT and a second carry output terminal CBT. The vertical start signal VS may be applied to the first input terminal IN of the carry signal generating circuit CARRY SIGNAL GENERATOR, a first clock signal CLK1 and a second clock signal may be applied to the first clock terminal CKA and the second clock terminal CKB, respectively, a reset signal RS may be applied to the reset terminal RT, the output terminal OT may output a gate output signal OUT[0] and the first carry output terminal CT and the second carry output terminal CBT may output a first carry signal CR[0] and a second carry signal CRB[0], respectively.

The shift register circuits SHIFT REGISTER[1], SHIFT REGISTER[2], SHIFT REGISTER[3], . . . may include a first input terminal IN, a second input terminal INB, a first clock terminal CKA, a second clock terminal CKB, a reset terminal RT, an output terminal OT, a first carry output terminal CT and a second carry output terminal CBT. First carry signals CR[0], CR[1], CR[2], . . . of corresponding previous stages may be applied to the first input terminals IN of the shift register circuits SHIFT REGISTER[1], SHIFT REGISTER[2], SHIFT REGISTER[3], . . . , respectively. Second carry signals CRB[0], CRB[1], CRB[2], . . . of the corresponding previous stages may be applied to the second input terminals INB of the shift register circuits SHIFT REGISTER[1], SHIFT REGISTER[2], SHIFT REGISTER[3], . . . , respectively. The first clock signal CLK1 and the second clock signal CLK2 may be alternately applied to the first clock terminals CKA and the second clock terminals CKB of the shift register circuits SHIFT REGISTER[1], SHIFT REGISTER[2], SHIFT REGISTER[3], . . . . The reset signal RS may be applied to the reset terminals of the shift register circuits SHIFT REGISTER[1], SHIFT REGISTER[2], SHIFT REGISTER[3], . . . . The output terminals OT of the shift register circuits SHIFT REGISTER[1], SHIFT REGISTER[2], SHIFT REGISTER[3], . . . may output the corresponding gate output signals OUT[1], OUT[2], OUT[3], . . . , respectively. The first carry terminals CT and the second carry terminals CBT may output the corresponding first carry signals CR[1], CR[2], CR[3], . . . and the corresponding second carry signals CRB[1], CRB[2], CRB[3], . . . , respectively.

For example, the carry signal generating circuits CARRY SIGNAL GENERATOR may receive the vertical start signal VS and output the first carry signal CR[0], the second carry signal CRB[0] and the gate output signal OUT[0]. A first stage shift register circuit SHIFT REGISTER[1] may receive the first carry signal CR[0] and the second carry signal CRB[0] and output a first stage first carry signal CR[1], a first stage second carry signal CRB[1] and a first stage gate output signal OUT[1].

A second stage shift register circuit SHIFT REGISTER[2] may receive the first stage first carry signal CR[1] and the first stage second carry signal CRB[1] of the first stage shift register circuit SHIFT REGISTER[1] and output a second stage first carry signal CR[2], a second stage second carry signal CRB[2] and a second stage gate output signal OUT[2].

A third stage shift register circuit SHIFT REGISTER[3] may receive the second stage first carry signal CR[2] and the second stage second carry signal CRB[2] of the second stage shift register circuit SHIFT REGISTER[2] and output a third stage first carry signal CR[3], a third stage second carry signal CRB[3] and a third stage gate output signal OUT[3].

Herein, the gate output signal OUT[0] of the carry signal generating circuit CARRY SIGNAL GENERATOR may not be outputted to the gate line of the display panel 100. The first stage gate output signal OUT[1], the second stage gate output signal OUT[2] and the third stage gate output signal OUT[3] may be outputted to a first gate line, a second gate line and a third gate line of the display panel 100.

Alternatively, the gate output signal OUT[0] of the carry signal generating circuit CARRY SIGNAL GENERATOR may be outputted to a first gate line of the display panel 100 to reduce a dead space. In this case, the first stage gate output signal OUT[1], the second stage gate output signal OUT[2] and the third stage gate output signal OUT[3] may be outputted to a second gate line, a third gate line and a fourth gate line of the display panel 100, respectively.

The first clock signal CLK1 and the second clock signal CLK2 may be alternately applied to stages. For example, the first clock signal CLK1 and the second clock signal CLK2 may be applied to the first clock terminal CKA and the second clock terminal CKB of the carry signal generating circuit CARRY SIGNAL GENERATOR and the second stage shift register circuit SHIFT REGISTER[2], respectively.

In contrast, the second clock signal CLK2 and the first clock signal CLK1 may be applied to the first clock terminal CKA and the second clock terminal CKB of the first stage shift register circuit SHIFT REGISTER[1] and the third stage shift register circuit SHIFT REGISTER[3], respectively.

The reset signal RS may be applied to each stage. Each stage may output the gate output signal not to turn on the pixels in response to the reset signal RS.

For example, the gate driver shown in FIG. 3 may generate the compensation gate signal GC. For example, the gate driver shown in FIG. 3 may generate the data initialization gate signal GI. In addition, the gate driver shown in FIG. 3 may be the emission driver 600 generating the emission signal EM.

Figure 4:
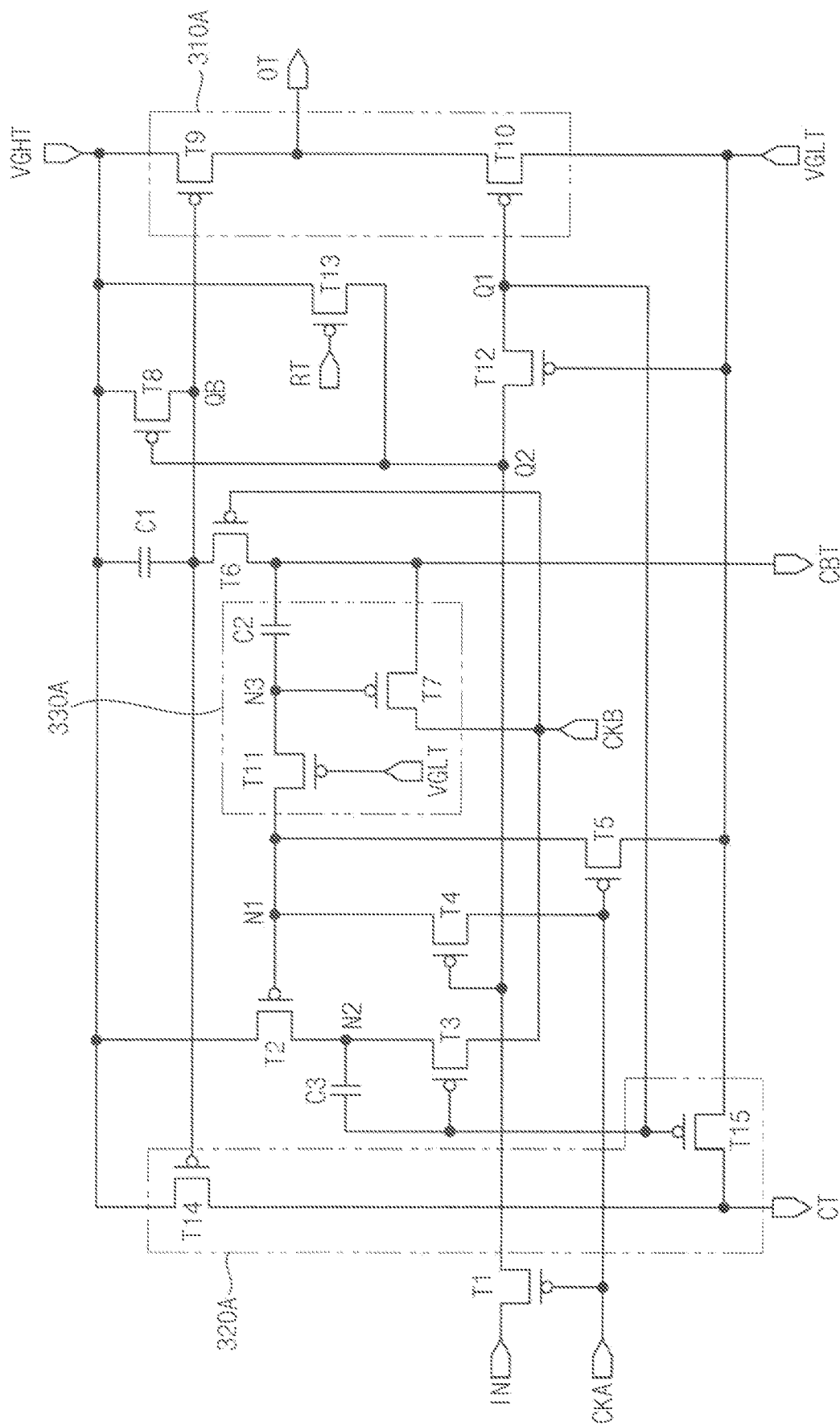
FIG. 4 is a circuit diagram illustrating a carry signal generating circuit of FIG. 3.
Figure 5:
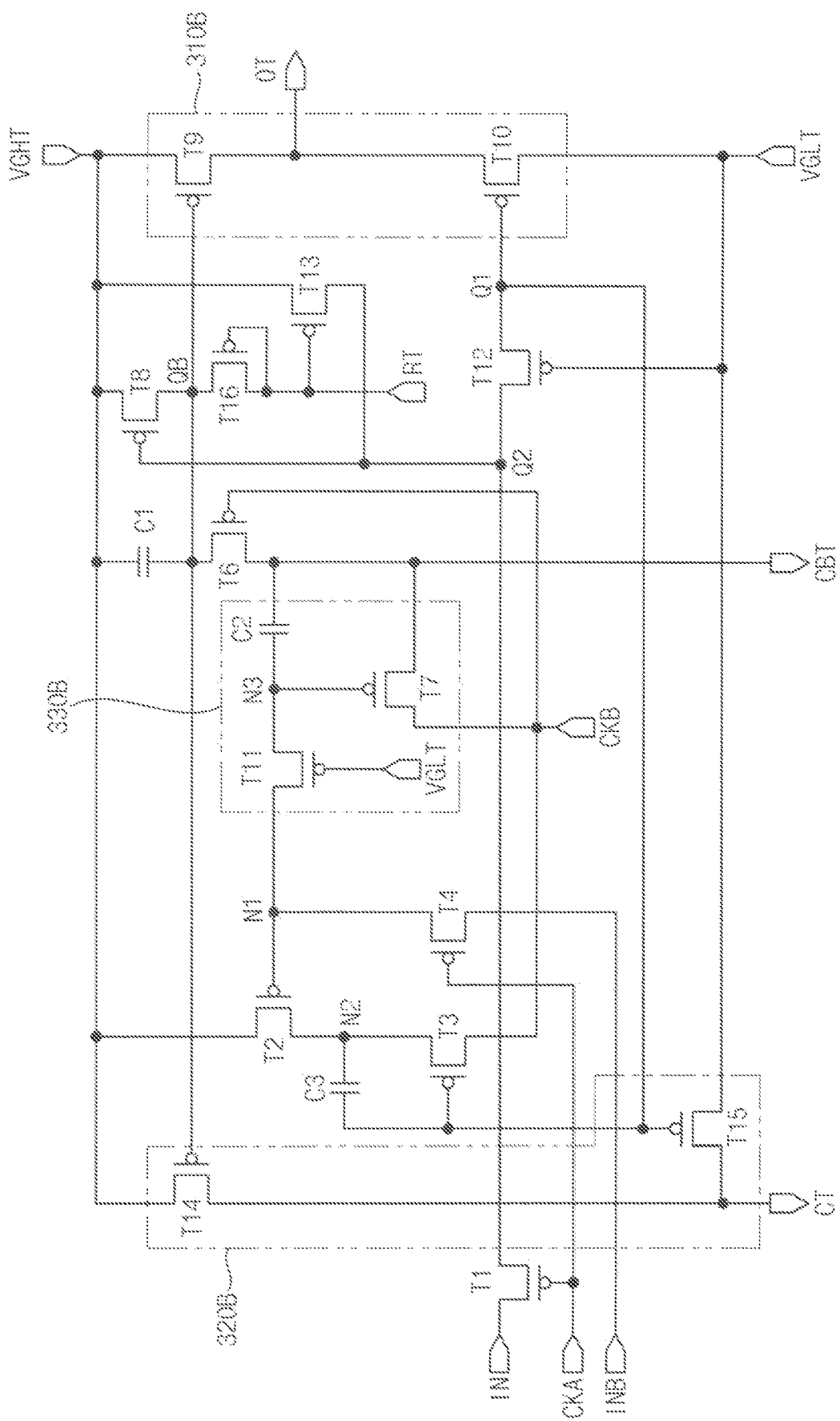
FIG. 5 is a circuit diagram illustrating a shift register circuit of FIG. 3.

FIG. 4 is a circuit diagram illustrating the carry signal generating circuit CARRY SIGNAL GENERATOR of FIG. 3. FIG. 5 is a circuit diagram illustrating the shift register circuit SHIFT REGISTER of FIG. 3.

Referring to FIGS. 1 to 5, a connection between transistors of the carry signal generating circuit CARRY SIGNAL GENERATOR may be different from a connection between transistors of the shift register circuit SHIFT REGISTER.

The carry signal generating circuit CARRY SIGNAL GENERATOR shown in FIG. 4 may include a first carry generator 320A generating the first carry signal CR[0], a second carry generator 330A generating the second carry signal CRB[0] and an output buffer 310A outputting the gate output signal OUT[0].

The shift register circuit SHIFT REGISTER shown in FIG. 5 may include a first stage first carry generator 320B generating the first stage first carry signal CR[1], a first stage second carry generator 330B generating the first stage second carry signal CRB[1] and a first stage output buffer 310B outputting the first stage gate output signal OUT[1].

For example, the carry signal generating circuit CARRY SIGNAL GENERATOR may include P-type transistors. For example, the shift register circuit SHIFT REGISTER may include P-type transistors.

Hereinafter, the circuit in FIG. 4 is explained in detail. The output buffer 310A may include a ninth transistor T9 including a control electrode connected to a QB node, an input electrode receiving a high power voltage VGH and an output electrode connected to an output terminal OT and a tenth transistor T10 including a control electrode connected to a Q1 node, an input electrode receiving a low power voltage VGL and an output electrode connected to the output terminal OT.

The first carry generator 320A may include a fourteenth transistor T14 including a control electrode connected to the QB node, an input electrode receiving the high power voltage VGH and an output electrode connected to a first carry output terminal CT and a fifteenth transistor T15 including a control electrode connected to the Q1 node, an input electrode receiving the low power voltage VGL and an output electrode connected to the first carry output terminal CT.

The second carry generator 330A may include a seventh transistor T7 including a control electrode connected to a third node N3, an input electrode receiving the second clock signal CLK2 and an output electrode connected to a second carry output terminal CBT, an eleventh transistor T11 including a control electrode receiving the low power voltage VGL, an input electrode connected to a first node N1 and an output electrode connected to the third node N3, and a second capacitor C2 including a first end connected to the third node N3 and a second end connected to the second carry output terminal CBT.

The carry signal generating circuit CARRY SIGNAL GENERATOR may further include a first transistor T1 including a control electrode receiving the first clock signal CLK1, an input electrode receiving the vertical start signal VS and an output electrode connected to a Q2 node, a second transistor T2 including a control electrode connected to the first node N1, an input electrode receiving the high power voltage VGH and an output electrode connected to a second node N2, a third transistor T3 including a control electrode connected to the Q1 node, an input electrode receiving the second clock signal CLK2 and an output electrode connected to the second node N2, a fourth transistor T4 including a control electrode connected to the Q2 node, an input electrode receiving the first clock signal CLK1 and an output electrode connected to the first node N1, a fifth transistor T5 including a control electrode receiving the first clock signal CLK1, an input electrode receiving the low power voltage VGL and an output electrode connected to the first node N1 and a third capacitor C3 including a first end connected to the Q1 node and a second end connected to the second node N2. The vertical start signal VS may be applied to the first input terminal IN.

The carry signal generating circuit CARRY SIGNAL GENERATOR may further include a sixth transistor T6 including a control electrode receiving the second clock signal CLK2, an input electrode connected to the QB node and an output electrode connected to the second carry output terminal CBT, an eighth transistor T8 including a control electrode connected to the Q2 node, an input electrode receiving the high power voltage VGH and an output electrode connected to the QB node, and a first capacitor C1 including a first end receiving the high power voltage VGH and a second end connected to the QB node.

The carry signal generating circuit CARRY SIGNAL GENERATOR may further include a twelfth transistor T12 including a control electrode receiving the low power voltage VGL, an input electrode connected to the Q2 node and an output electrode connected to the Q1 node.

The carry signal generating circuit CARRY SIGNAL GENERATOR may further include a thirteenth transistor T13 including a control electrode receiving the reset signal RS, an input electrode receiving the high power voltage VGH and an output electrode connected to the Q2 node.

In FIG. 4, the high power voltage VGH may be applied to a high power terminal VGHT and the low power voltage VGL may be applied to a low power terminal VGLT. In FIG. 4, the first clock signal CLK1 is applied to the first clock terminal CKA and the second clock signal CLK2 may be applied to the second clock terminal CKB.

Compared to the circuit of FIG. 4, the circuit of FIG. 5 has a slightly different connection of the fourth transistor T4. In addition, the circuit of FIG. 5 may not include the fifth transistor T5 and may further include a sixteenth transistor T16 compared to the circuit of FIG. 4.

For convenience of explanation, the first clock signal CLK1 and the second clock signal CLK2 illustrated in FIG. 5 are the same as those illustrated in FIG. 4. However, the first clock signal CLK1 and the second clock signal CLK2 in FIG. 5 may be opposite to the first clock signal CLK1 and the second clock signal CLK2 in FIG. 4 when the shift register circuit is the first stage shift register SHIFT REGISTER[1] or the third stage shift register SHIFT REGISTER[3]. The first clock signal CLK1 and the second clock signal CLK2 in FIG. 5 may be same as the first clock signal CLK1 and the second clock signal CLK2 in FIG. 4 when the shift register circuit is the second stage shift register SHIFT REGISTER[2] or the fourth stage shift register SHIFT REGISTER[4].

Hereinafter, the circuit in FIG. 5 is explained in detail. The first stage output buffer 310B may include a ninth transistor T9 including a control electrode connected to a QB node, an input electrode receiving the high power voltage VGH and an output electrode connected to a first stage output terminal OT, and a tenth transistor T10 including a control electrode connected to a Q1 node, an input electrode receiving the low power voltage VGL and an output electrode connected to the first stage output terminal OT.

The first stage first carry generator 320B may include a fourteenth transistor T14 including a control electrode connected to the QB node, an input electrode receiving the high power voltage VGH and an output electrode connected to a first stage first carry output terminal CT, and a fifteenth transistor T15 including a control electrode connected to the Q1 node, an input electrode receiving the low power voltage VGL and an output electrode connected to the first stage first carry output terminal CT.

The first stage second carry generator 330B may include a seventh transistor T7 including a control electrode connected to a third node N3, an input electrode receiving the second clock signal CLK2 and an output electrode connected to a first stage second carry output terminal CBT, an eleventh transistor T11 including a control electrode receiving the low power voltage VGL, an input electrode connected to a first node N1 and an output electrode connected to the third node N3, and a second capacitor C2 including a first end connected to the third node N3 and a second end connected to the first stage second carry output terminal CBT.

The shift register circuit SHIFT REGISTER may further include a first transistor T1 including a control electrode receiving the first clock signal CLK1, an input electrode receiving the first carry signal CR[0] and an output electrode connected to a Q2 node, a second transistor T2 including a control electrode connected to the first node N1, an input electrode receiving the high power voltage VGH and an output electrode connected to a second node N2, a third transistor T3 including a control electrode connected to the Q1 node, an input electrode receiving the second clock signal CLK2 and an output electrode connected to the second node N2, a fourth transistor T4 including a control electrode receiving the first clock signal CLK1, an input electrode receiving the second carry signal CRB[0] and an output electrode connected to the first node N1, and a third capacitor C3 including a first end connected to the Q1 node and a second end connected to the second node N2. The first carry signal CR[0] may be applied to the first input terminal IN and the second carry signal CRB[0] may be applied to the second input terminal INB.

The shift register circuit SHIFT REGISTER may further include a sixth transistor T6 including a control electrode receiving the second clock signal CLK2, an input electrode connected to the QB node and an output electrode connected to the first stage second carry output terminal CBT, an eighth transistor T8 including a control electrode connected to the Q2 node, an input electrode receiving the high power voltage VGH and an output electrode connected to the QB node, and a first capacitor C1 including a first end receiving the high power voltage VGH and a second end connected to the QB node.

The shift register circuit SHIFT REGISTER may further include a twelfth transistor T12 including a control electrode receiving the low power voltage VGL, an input electrode connected to the Q2 node and an output electrode connected to the Q1 node.

The shift register circuit SHIFT REGISTER may further include a thirteenth transistor T13 including a control electrode receiving the reset signal RS, an input electrode receiving the high power voltage VGH and an output electrode connected to the Q2 node, and a sixteenth transistor T16 including a control electrode receiving the reset signal RS, an input electrode receiving the reset signal RS and an output electrode connected to the QB node.

In FIG. 5, the high power voltage VGH may be applied to a high power terminal VGHT and the low power voltage VGL may be applied to a low power terminal VGLT.

Figure 6:
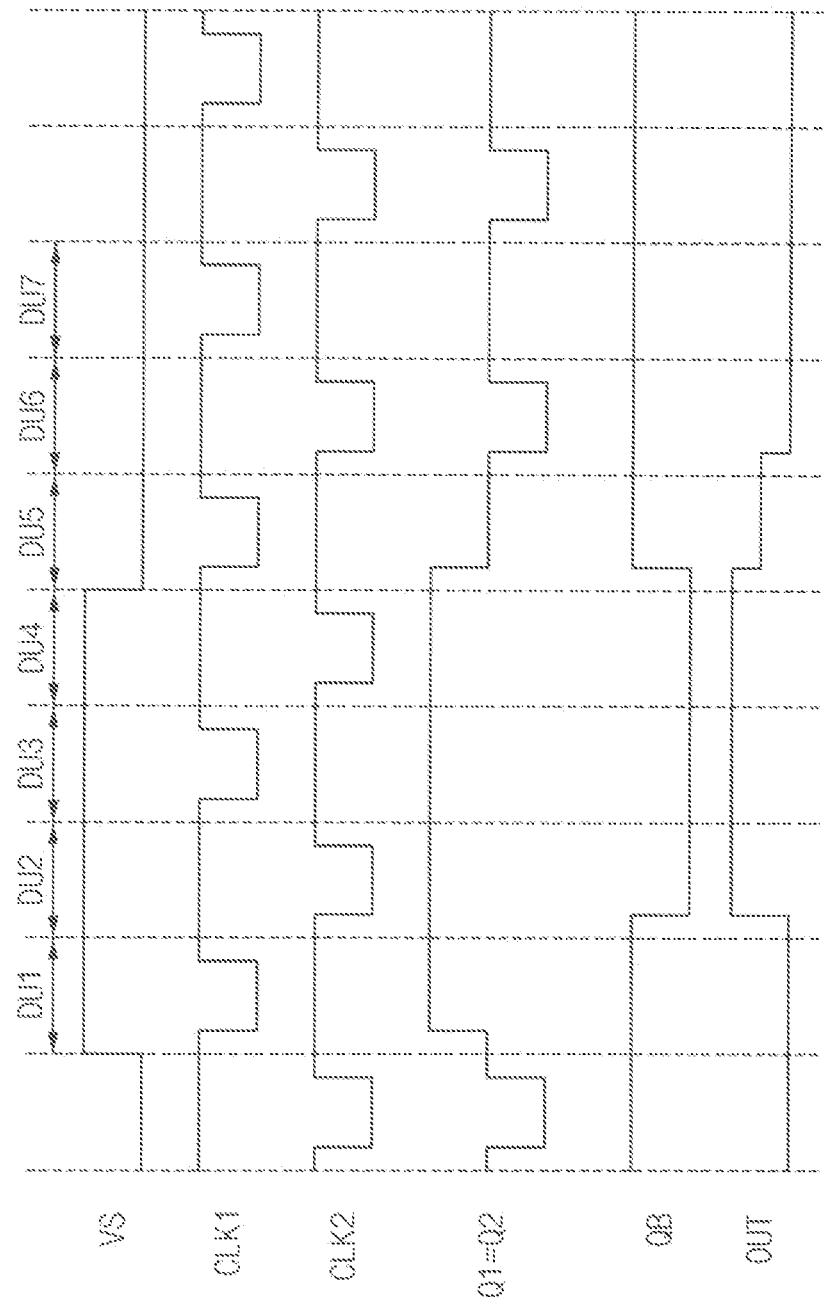
FIG. 6 is a timing diagram illustrating input signals, node signals and an output signal of the carry signal generating circuit and the shift register circuit of FIG. 3.
Figure 7A:
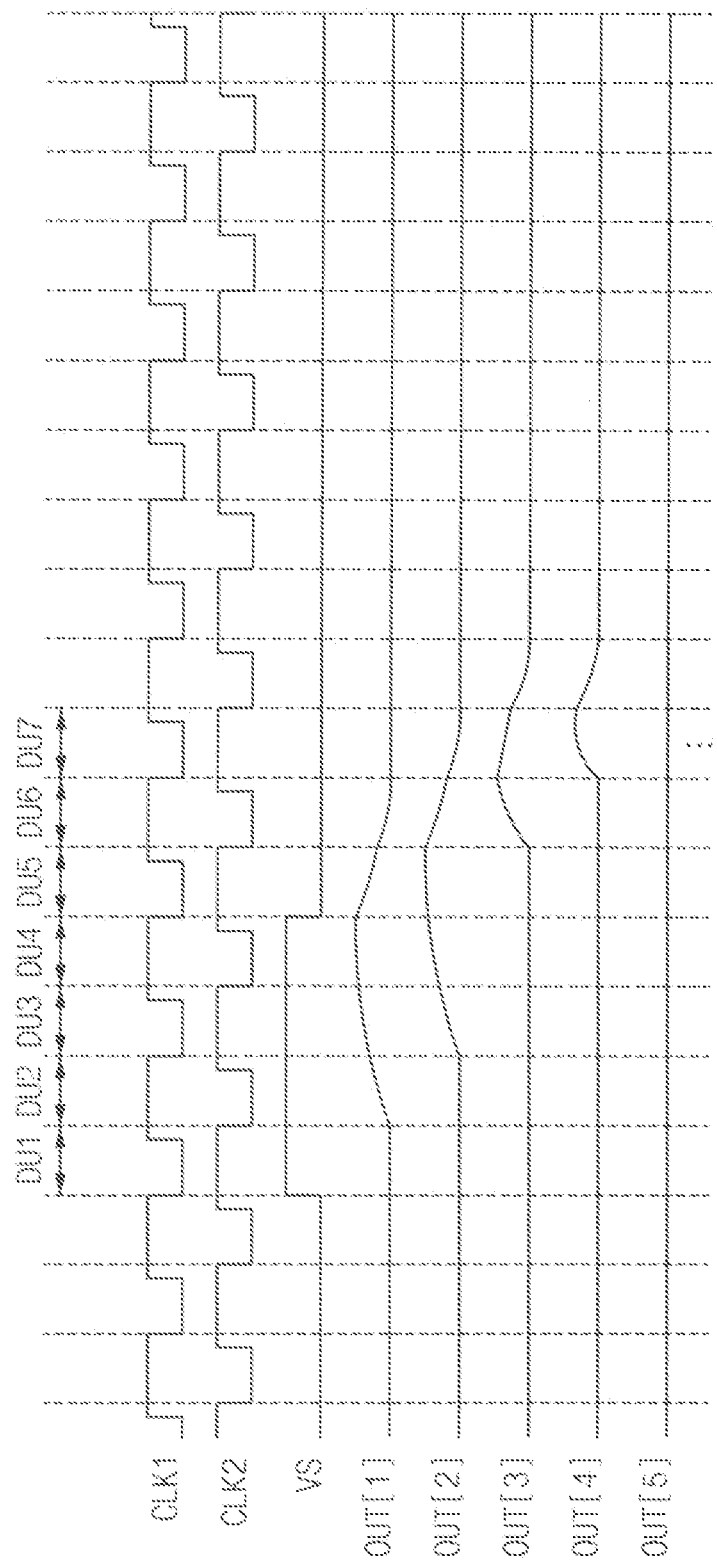
FIG. 7A is a timing diagram illustrating input signals and output signals of a gate driver according to a comparative embodiment.

FIG. 6 is a timing diagram illustrating input signals, node signals and an output signal of the carry signal generating circuit CARRY SIGNAL GENERATOR and the shift register circuit SHIFT REGISTER of FIG. 3. FIG. 7A is a timing diagram illustrating input signals and output signals of a gate driver according to a comparative embodiment. FIG. 7B is a timing diagram illustrating input signals and output signals of the gate driver 300 of FIG. 3.

Referring to FIGS. 1 to 7B, the first clock signal CLK1 has low pulses in first, third, fifth and seventh durations DU1, DU3, DU5 and DU7 and the second clock signal CLK2 has low pulses in second, fourth and sixth durations DU2, DU4 and DU6.

A voltage of the Q1 node may rise at a falling edge of the first clock signal CLK1 in the first duration DU1, may fall to a first low level at a falling edge of the first clock signal CLK1 in the fifth duration DU5 after the vertical start signal VS falls to a low level, and may fall to a second low level at a falling edge of the second clock signal CLK2 in the sixth duration DU6. After the seventh duration DU7, the voltage of the Q1 node may rise to the first low level when the second clock signal CLK2 rises and the voltage of the Q1 node may fall to the second low level when the second clock signal CLK2 falls.

A voltage of the QB node may fall to a low level at a falling edge of the second clock signal CLK2 in the second duration DU2. The voltage of the QB node may rise to a high level at a falling edge of the first clock signal CLK1 in the fifth duration DU5.

The gate output signal OUT may rise to a high level at a falling edge of the second clock signal CLK2 in the second duration DU2. The gate output signal OUT slightly decreases at a falling edge of the first clock signal CLK1 in the fifth duration DU5 and falls to a low level at a falling edge of the second clock signal CLK2 in the sixth duration DU6.

Hereinafter, an operation of the carry signal generating circuit CARRY SIGNAL GENERATOR in FIG. 4 is explained in detail. When the first clock signal CLK1 falls to the low level in the first duration DU1, the first transistor T1 is turned on and the voltage of the Q1 node and the voltage of the Q2 node rise to the high level. When the voltage of the Q1 node and the voltage of the Q2 node rise to the high level in the first duration DU1, the fourth transistor T4 is turned off. In addition, when the first clock signal CLK1 falls to the low level in the first duration DU1, the fifth transistor T5 is turned on and the low power voltage VGL is applied to the first node N1 and the third node N3. When the low power voltage VGL is applied to the first node N1 and the third node N3 in the first duration DU1, the second transistor T2 and the seventh transistor T7 are turned on.

When the second clock signal CLK2 falls to the low level in the second duration DU2 while the seventh transistor T7 is turned on, the sixth transistor T6 is turned on so that the voltage of the QB node falls to the low level through a path generated by the sixth transistor T6 and the seventh transistor T7. When the voltage of the QB node falls to the low level in the second duration DU2, the ninth transistor T9 is turned on and the gate output signal OUT has the high level. In addition, when the voltage of the QB node falls to the low level in the second duration DU2, the fourteenth transistor T14 is turned on and the first carry signal CR has the high level. In addition, the voltage of the first node N1 and the voltage of the third node N3 have the low level in the second duration DU2, the waveform of the second clock signal CLK2 may be outputted as the waveform of the second carry signal CRB through the seventh transistor T7. During a period in which the voltage of the Q1 node and the voltage of the Q2 node have the high level (e.g. during the first duration DU1 to the fourth duration DU4), the waveform of the second clock signal CLK2 may be outputted as the waveform of the second carry signal CRB through the seventh transistor T7.

In the fifth duration DU5, the vertical start signal VS has the low level. When the first clock signal CLK1 falls to the low level in the fifth duration DU5, the first transistor T1 is turned on and the vertical start signal VS having the low level is transmitted to the Q2 node through the first transistor T1. Thus, in the fifth duration DU5, the voltage of the Q1 node and the voltage of the Q2 node fall to the low level. When the voltage of the Q1 node and the voltage of the Q2 node fall to the low level in the fifth duration DU5, the eighth transistor T8 is turned on so that the voltage of the QB node rises to the high level. In addition, in the fifth duration DU5, the ninth transistor T9 is turned off due to the high level of the voltage of the QB node and the tenth transistor T10 is turned on due to the low level of the voltage of the Q1 node so that the gate output voltage OUT falls to the low level. Similarly, in the fifth duration DU5, the fourteenth transistor T14 is turned off due to the high level of the voltage of the QB node and the fifteenth transistor T15 is turned on due to the low level of the voltage of the Q1 node so that the first carry signal CR falls to the low level.

In addition, when the first clock CLK1 rises to the high level at the end of the fifth duration DU5, the fifth transistor T5 is turned off and the voltage having the high level is applied to the first node N1 and the third node N3 which are the control electrodes of the second transistor T2 and the seventh transistor T7 through the fourth transistor T4. When the first clock CLK1 rises to the high level at the end of the fifth duration DU5, the seventh transistor T5 is turned off so that the second clock signal CLK2 is not outputted as the second carry signal CRB but the high level of the voltage of the QB node is outputted as the second carry signal CRB through the sixth transistor T6. Thus, the second carry signal CRB maintains the high level after the fifth duration DU5.

Input signals of the shift register circuit SHIFT REGISTER of FIG. 5 is substantially the same as the input signals of the carry signal generating circuit CARRY SIGNAL GENERATOR of FIG. 4 except that the first carry signal CR of the previous stage is applied to the first input terminal IN instead of the vertical start signal VS, the second carry signal CRB of the previous stage is applied to the second input terminal INB, and the second carry signal CRB of the previous stage is applied to an electrode of the fourth transistor T4. In addition, the timing diagram of FIG. 6 may be applied to the shift register circuit SHIFT REGISTER of FIG. 5 as well as the carry signal generating circuit CARRY SIGNAL GENERATOR of FIG. 4 in a substantially same manner.

As shown in FIG. 7A, the waveform of the gate output signal of the gate driver 300 may be broken due to the high-speed driving and an increase of the output load. The gate output signal OUT[1] of the first stage and the gate output signal OUT[2] of the second stage may be normally outputted but the gate output signals OUT[3], OUT[4], OUT[5], . . . of the stages after the second stage may be broken. When the gate output signal is used as the carry signal for the next stage, the gate output signal may not be well transmitted to the next stage due to the increase of the number of pixels to be driven by the gate driver 300, the increase of the length of the gate line and the increase of the parasitic capacitance of the gate line so that the waveform of the gate output signal may be broken.

As shown in FIG. 7B, the first carry signal CR and the second carry signal CRB generated at one stage are applied to a right next stage so that the waveform of the gate output signal OUT may not be broken regardless of the increase of the output load of the gate output signal OUT so that the shift register circuit SHIFT REGISTER may normally operate.

According to the present embodiment, the gate driver 300 includes the carry signal generating circuit CARRY SIGNAL GENERATOR including the output buffer 310A, the first carry generator 320A and the second carry generator 330A and the shift register circuit SHIFT REGISTER including the output buffer 310B, the first carry generator 320B and the second carry generator 330B. The shift register circuit SHIFT REGISTER operates based on the first carry signal CR[0] and the second carry signal CRB[0] generated by the carry signal generating circuit CARRY SIGNAL GENERATOR so that the gate driver 300 may stably output the gate signal.

Thus, the stability and the reliability of the gate driver 300 may be enhanced and the display quality of the display panel 100 may be enhanced.

Figure 8:
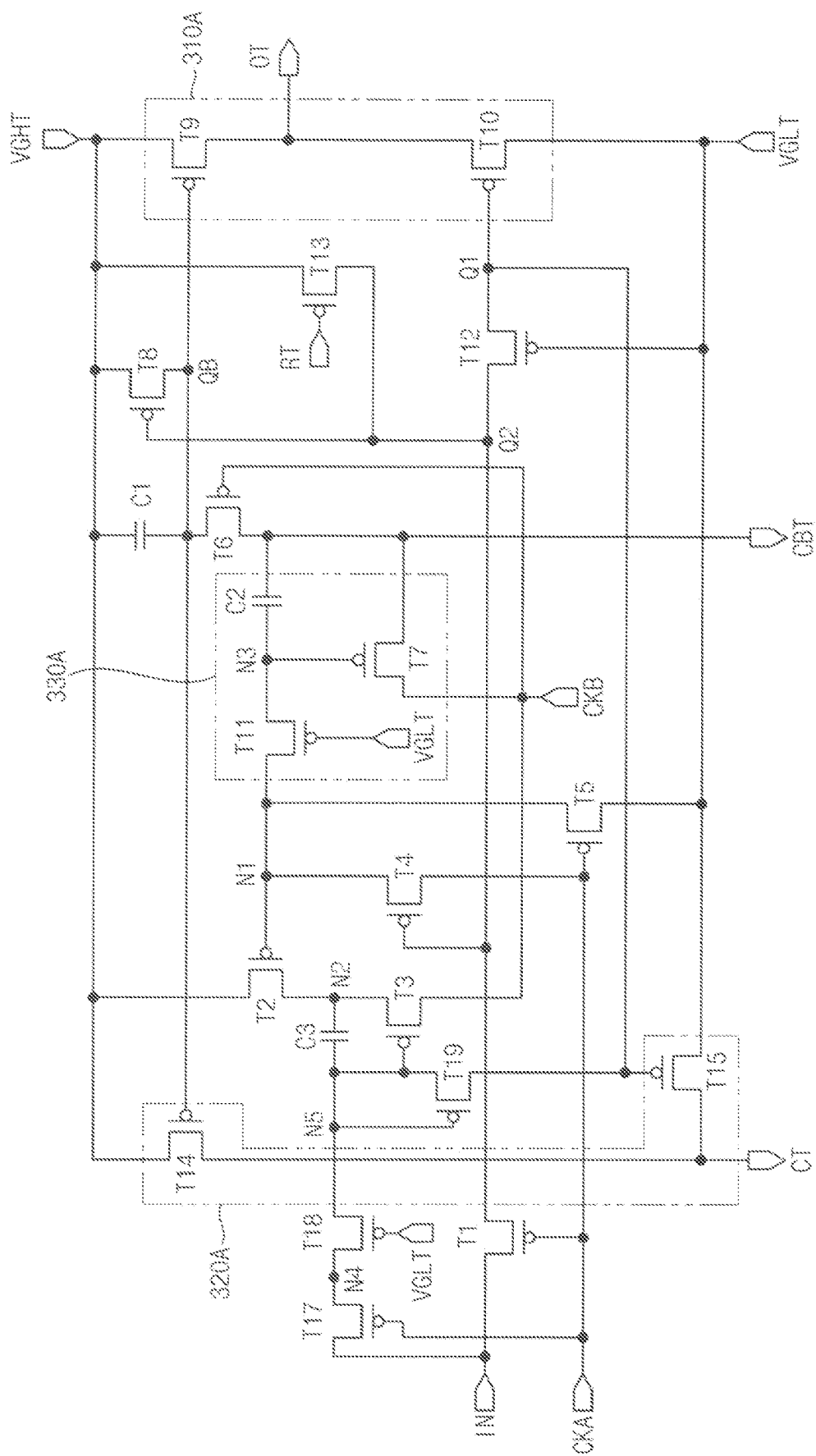
FIG. 8 is a circuit diagram illustrating a carry signal generating circuit of a gate driver according to an embodiment of the present inventive concept.
Figure 9:
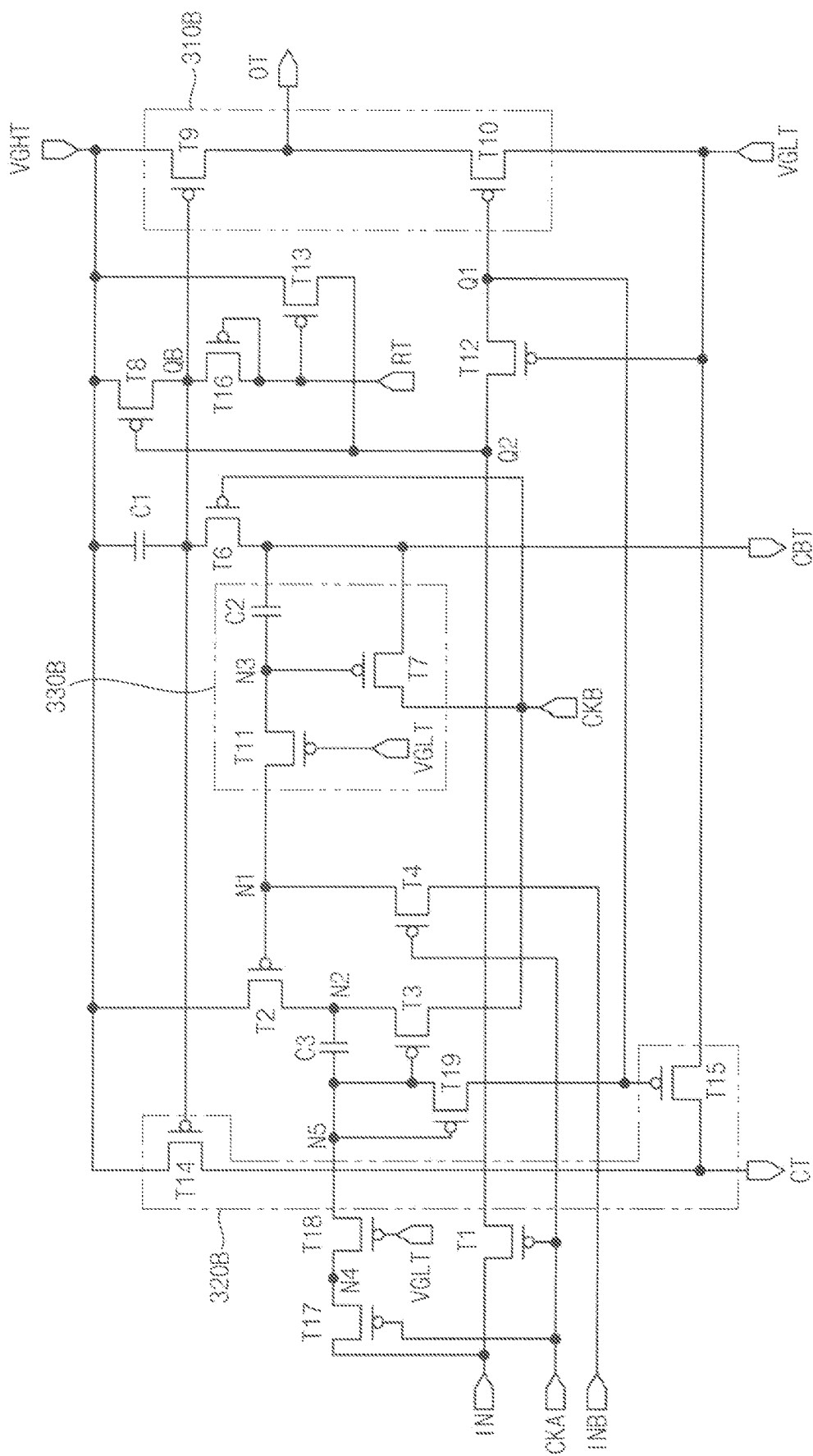
FIG. 9 is a circuit diagram illustrating a shift register circuit of the gate driver of FIG. 8.
Figure 10:
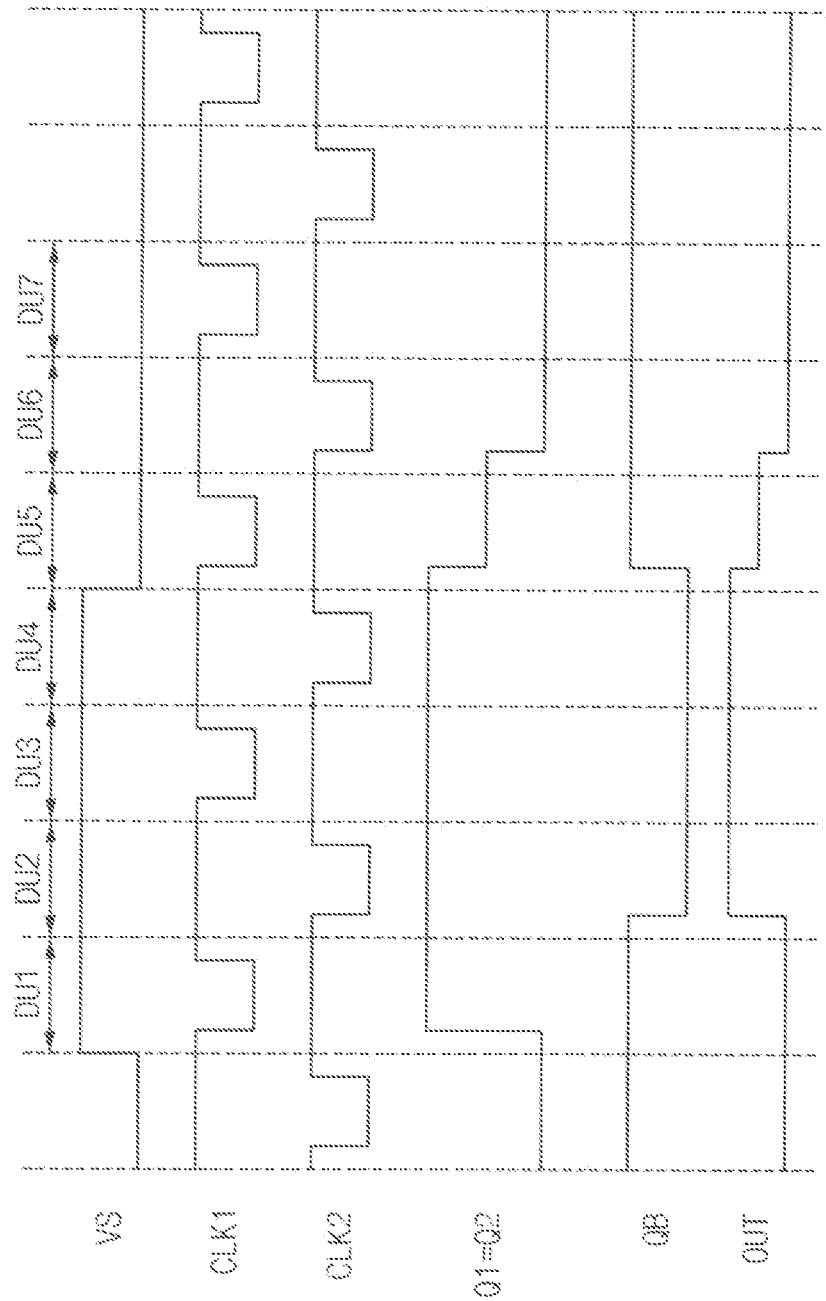
FIG. 10 is a timing diagram illustrating input signals, node signals and an output signal of the carry signal generating circuit of FIG. 8 and the shift register circuit of FIG. 9.

FIG. 8 is a circuit diagram illustrating a carry signal generating circuit CARRY SIGNAL GENERATOR of a gate driver 300 according to an embodiment of the present inventive concept. FIG. 9 is a circuit diagram illustrating a shift register circuit SHIFT REGISTER of the gate driver 300 of FIG. 8. FIG. 10 is a timing diagram illustrating input signals, node signals and an output signal of the carry signal generating circuit CARRY SIGNAL GENERATOR of FIG. 8 and the shift register circuit SHIFT REGISTER of FIG. 9.

The carry signal generating circuit CARRY SIGNAL GENERATOR of the gate driver 300 according to the present embodiment is substantially the same as the carry signal generating circuit CARRY SIGNAL GENERATOR of the previous embodiment explained referring to FIG. 4 except that the carry signal generating circuit CARRY SIGNAL GENERATOR further includes seventeenth, eighteenth and nineteenth transistors. The shift register circuit SHIFT REGISTER of the gate driver 300 according to the present embodiment is substantially the same as the shift register circuit SHIFT REGISTER of the previous embodiment explained referring to FIG. 5 except that the shift register circuit SHIFT REGISTER further includes seventeenth, eighteenth and nineteenth transistors. Thus, the same reference numerals will be used to refer to the same or like parts as those described in the previous embodiment of FIGS. 1 to 7B and any repetitive explanation concerning the above elements will be omitted.

Referring to FIGS. 1, 2, 3, 6, 7B, 8, 9 and 10, the display apparatus includes a display panel 100 and a display panel driver. The display panel driver includes a driving controller 200, a gate driver 300, a gamma reference voltage generator 400, a data driver 500 and an emission driver 600.

In the present embodiment, the gate driver 300 includes a carry signal generating circuit CARRY SIGNAL GENERATOR receiving the vertical start signal VS and outputting the first carry signal CR[0], the second carry signal CRB[0] and the gate output signal OUT[0], and a first stage shift register circuit SHIFT REGISTER[1] receiving the first carry signal CR[0], the second carry signal CRB[0] and outputting the first stage first carry signal CR[1], the first stage second carry signal CRB[1] and the first stage gate output signal OUT[1].

A connection between transistors of the carry signal generating circuit CARRY SIGNAL GENERATOR may be different from a connection between transistors of the shift register circuit SHIFT REGISTER.

The carry signal generating circuit CARRY SIGNAL GENERATOR shown in FIG. 8 may include a first carry generator 320A generating the first carry signal CR[0], a second carry generator 330A generating the second carry signal CRB[0] and an output buffer 310A outputting the gate output signal OUT[0].

The shift register circuit SHIFT REGISTER shown in FIG. 9 may include a first stage first carry generator 320B generating the first stage first carry signal CR[1], a first stage second carry generator 330B generating the first stage second carry signal CRB[1] and a first stage output buffer 310B outputting the first stage gate output signal OUT[1].

As shown in FIG. 8, the carry signal generating circuit CARRY SIGNAL GENERATOR may further include a seventeenth transistor T17 including a control electrode receiving the first clock signal CLK1, an input electrode receiving the vertical start signal VS and an output electrode connected to a fourth node N4, and an eighteenth transistor T18 including a control electrode receiving the low power voltage VGL, an input electrode connected to the fourth node N4 and an output electrode connected to a fifth node N5.

In addition, the carry signal generating circuit CARRY SIGNAL GENERATOR may further include a nineteenth transistor T19 including a control electrode connected to the fifth node N5, an input electrode connected to the fifth node N5 and an output electrode connected to the Q1 node.

As shown in FIG. 9, the shift register circuit SHIFT REGISTER may further include a seventeenth transistor T17 including a control electrode receiving the first clock signal CLK1, an input electrode receiving the first carry signal CR[0] and an output electrode connected to a fourth node N4, and an eighteenth transistor T18 including a control electrode receiving the low power voltage VGL, an input electrode connected to the fourth node N4 and an output electrode connected to a fifth node N5.

In addition, the shift register circuit SHIFT REGISTER may further include a nineteenth transistor T19 including a control electrode connected to the fifth node N5, an input electrode connected to the fifth node N5 and an output electrode connected to the Q1 node.

The waveform diagram of FIG. 10 is substantially the same as the waveform diagram of FIG. 6 except for the waveform of the voltage of the Q1 node.

In FIG. 10, the first clock signal CLK1 has low pulses in first, third, fifth and seventh durations DU1, DU3, DU5 and DU7 and the second clock signal CLK2 has low pulses in second, fourth and sixth durations DU2, DU4 and DU6.

In FIG. 10, a voltage of the Q1 node may rise at a falling edge of the first clock signal CLK1 in the first duration DU1, may fall to a first low level at a falling edge of the first clock signal CLK1 in the fifth duration DU5 after the vertical start signal VS falls to a low level, and may fall to a second low level at a falling edge of the second clock signal CLK2 in the sixth duration DU6. After the seventh duration DU7, the voltage of the Q1 node may not rise to the first low level when the second clock signal CLK2 rises but the voltage of the Q1 node may maintain the second low level by the operation of the nineteenth transistor T19.

According to the present embodiment, the gate driver 300 includes the carry signal generating circuit CARRY SIGNAL GENERATOR including the output buffer 310A, the first carry generator 320A and the second carry generator 330A and the shift register circuit SHIFT REGISTER including the output buffer 310B, the first carry generator 320B and the second carry generator 330B. The shift register circuit SHIFT REGISTER operates based on the first carry signal CR[0] and the second carry signal CRB[0] generated by the carry signal generating circuit CARRY SIGNAL GENERATOR so that the gate driver 300 may stably output the gate signal.

Thus, the stability and the reliability of the gate driver 300 may be enhanced and the display quality of the display panel 100 may be enhanced.

Figure 11:
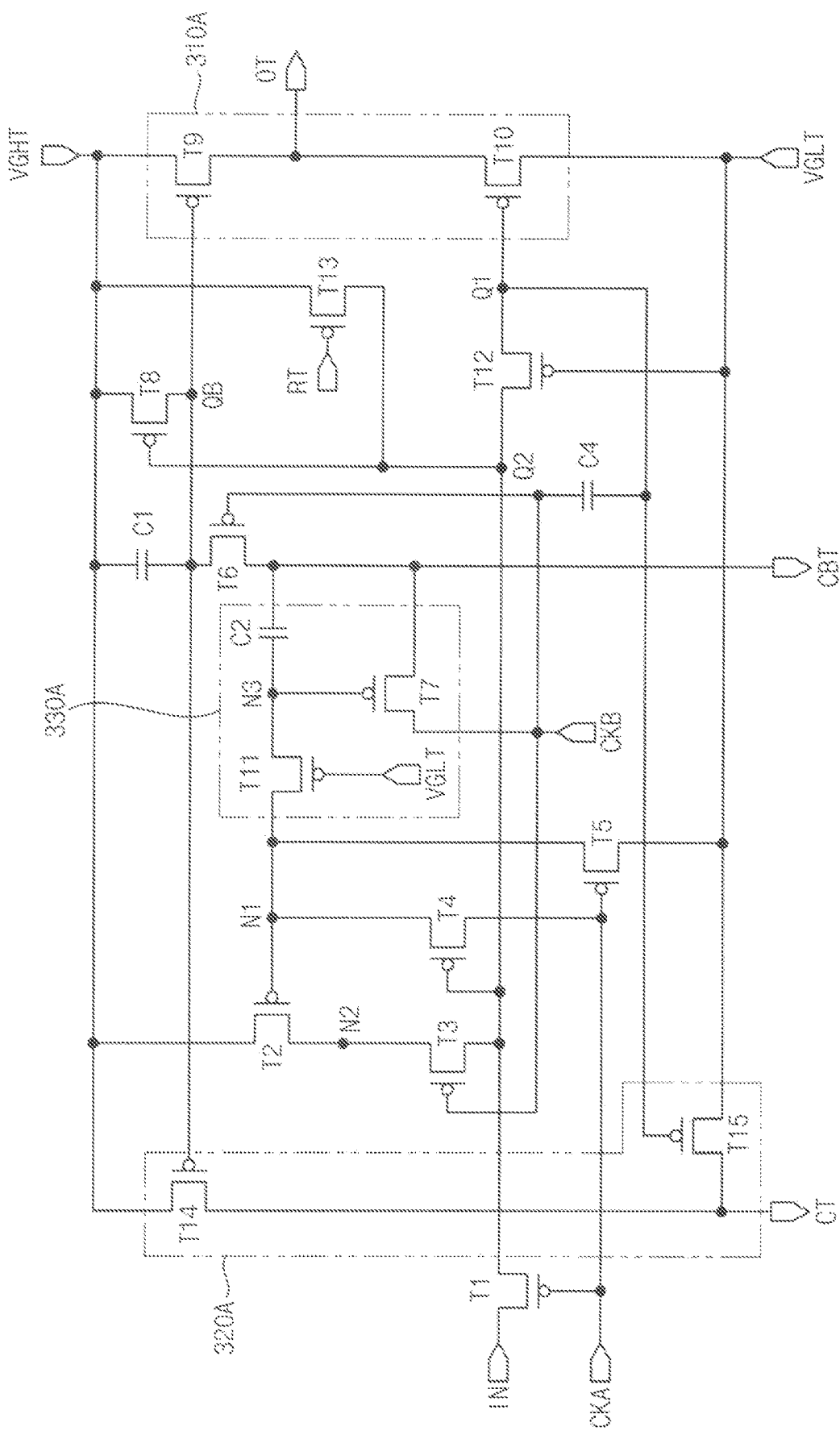
FIG. 11 is a circuit diagram illustrating a carry signal generating circuit of a gate driver according to an embodiment of the present inventive concept.
Figure 12:
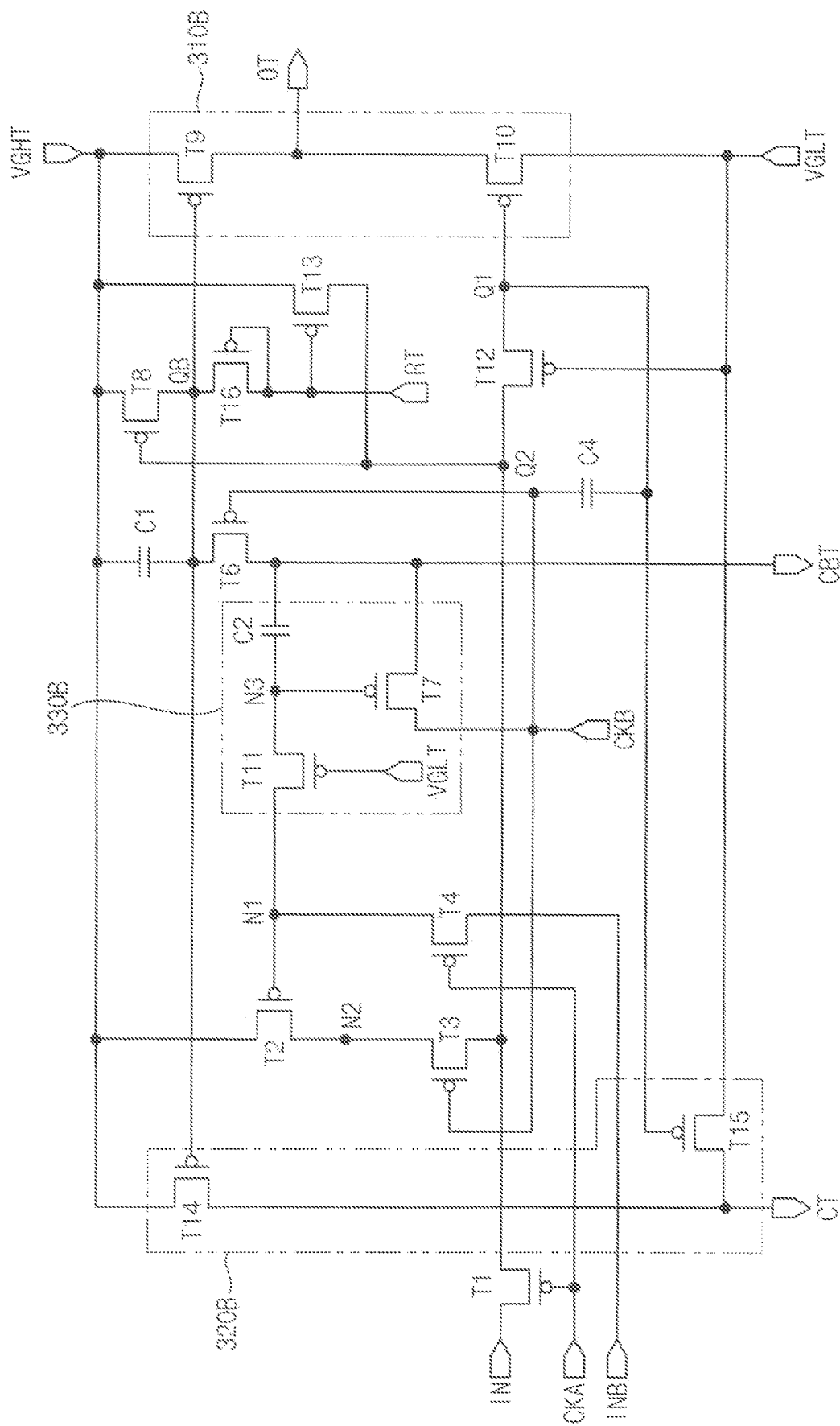
FIG. 12 is a circuit diagram illustrating a shift register circuit of the gate driver of FIG. 11.
Figure 13:
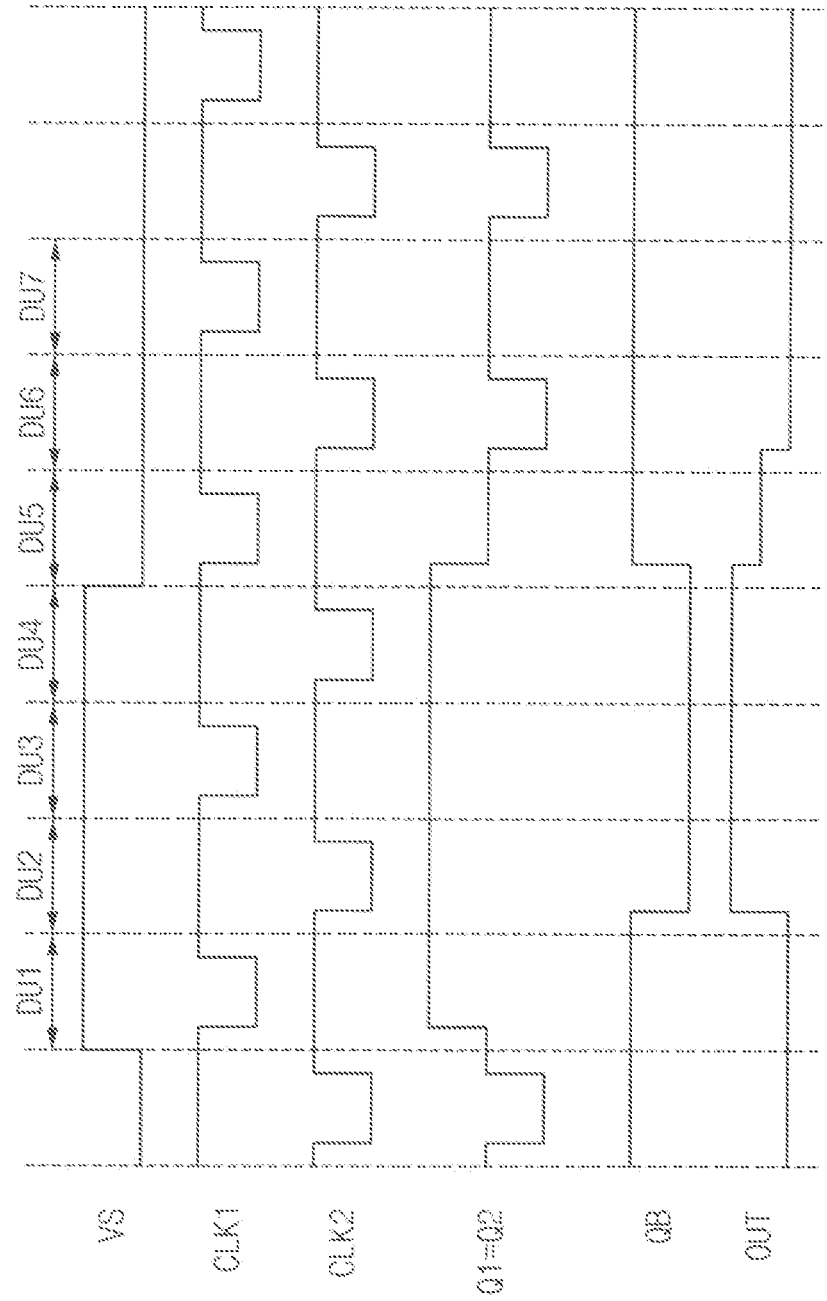
FIG. 13 is a timing diagram illustrating input signals, node signals and an output signal of the carry signal generating circuit of FIG. 11 and the shift register circuit of FIG. 12.

FIG. 11 is a circuit diagram illustrating a carry signal generating circuit CARRY SIGNAL GENERATOR of a gate driver 300 according to an embodiment of the present inventive concept. FIG. 12 is a circuit diagram illustrating a shift register circuit SHIFT REGISTER of the gate driver of FIG. 11. FIG. 13 is a timing diagram illustrating input signals, node signals and an output signal of the carry signal generating circuit CARRY SIGNAL GENERATOR of FIG. 11 and the shift register circuit SHIFT REGISTER of FIG. 12.

The carry signal generating circuit CARRY SIGNAL GENERATOR of the gate driver 300 according to the present embodiment is substantially the same as the carry signal generating circuit CARRY SIGNAL GENERATOR of the previous embodiment explained referring to FIG. 4 except for the connection of the third transistor T3 and except that the carry signal generating circuit CARRY SIGNAL GENERATOR does not include the third capacitor but further includes a fourth capacitor. The shift register circuit SHIFT REGISTER of the gate driver 300 according to the present embodiment is substantially the same as the shift register circuit SHIFT REGISTER of the previous embodiment explained referring to FIG. 5 except for the connection of the third transistor T3 and except that the shift register circuit SHIFT REGISTER does not include the third capacitor but further includes a fourth capacitor. Thus, the same reference numerals will be used to refer to the same or like parts as those described in the previous embodiment of FIGS. 1 to 7B and any repetitive explanation concerning the above elements will be omitted.

Referring to FIGS. 1, 2, 3, 6, 7B, 11, 12 and 13, the display apparatus includes a display panel 100 and a display panel driver. The display panel driver includes a driving controller 200, a gate driver 300, a gamma reference voltage generator 400, a data driver 500 and an emission driver 600.

In the present embodiment, the gate driver 300 includes a carry signal generating circuit CARRY SIGNAL GENERATOR receiving the vertical start signal VS and outputting the first carry signal CR[0], the second carry signal CRB[0] and the gate output signal OUT[0], and a first stage shift register circuit SHIFT REGISTER[1] receiving the first carry signal CR[0], the second carry signal CRB[0] and outputting the first stage first carry signal CR[1], the first stage second carry signal CRB[1] and the first stage gate output signal OUT[1].

A connection between transistors of the carry signal generating circuit CARRY SIGNAL GENERATOR may be different from a connection between transistors of the shift register circuit SHIFT REGISTER.

The carry signal generating circuit CARRY SIGNAL GENERATOR shown in FIG. 11 may include a first carry generator 320A generating the first carry signal CR[0], a second carry generator 330A generating the second carry signal CRB[0] and an output buffer 310A outputting the gate output signal OUT[0].

The shift register circuit SHIFT REGISTER shown in FIG. 12 may include a first stage first carry generator 320B generating the first stage first carry signal CR[1], a first stage second carry generator 330B generating the first stage second carry signal CRB[1] and a first stage output buffer 310B outputting the first stage gate output signal OUT[1].

As shown in FIG. 11, the carry signal generating circuit CARRY SIGNAL GENERATOR may further include a first transistor T1 including a control electrode receiving the first clock signal CLK1, an input electrode receiving the vertical start signal VS and an output electrode connected to a Q2 node, a second transistor T2 including a control electrode connected to the first node N1, an input electrode receiving the high power voltage VGH and an output electrode connected to a second node N2, a third transistor T3 including a control electrode receiving the second clock signal CLK2, an input electrode connected to the second node N2 and an output electrode connected to the Q2 node, a fourth transistor T4 including a control electrode connected to the Q2 node, an input electrode receiving the first clock signal CLK1 and an output electrode connected to the first node N1, and a fifth transistor T5 including a control electrode receiving the first clock signal CLK1, an input electrode receiving the low power voltage VGL and an output electrode connected to the first node N1.

In addition, the carry signal generating circuit CARRY SIGNAL GENERATOR may further include a sixth transistor T6 including a control electrode receiving the second clock signal CLK2, an input electrode connected to the QB node and an output electrode connected to the second carry output terminal CBT, an eighth transistor T8 including a control electrode connected to the Q2 node, an input electrode receiving the high power voltage VGH and an output electrode connected to the QB node, a first capacitor C1 including a first end receiving the high power voltage VGH and a second end connected to the QB node, and a fourth capacitor C4 including a first end receiving the second clock signal CLK2 and a second end connected to the Q1 node.

As shown in FIG. 12, the shift register circuit SHIFT REGISTER may further include a first transistor T1 including a control electrode receiving the first clock signal CLK1, an input electrode receiving the first carry signal CR[0] and an output electrode connected to a Q2 node, a second transistor T2 including a control electrode connected to the first node N1, an input electrode receiving the high power voltage VGH and an output electrode connected to a second node N2, a third transistor T3 including a control electrode receiving the second clock signal CLK2, an input electrode connected to the second node N2 and an output electrode connected to the Q2 node, and a fourth transistor T4 including a control electrode receiving the first clock signal CLK1, an input electrode receiving the second carry signal CRB[0] and an output electrode connected to the first node N1.

In addition, the shift register circuit SHIFT REGISTER may further include a sixth transistor T6 including a control electrode receiving the second clock signal CLK2, an input electrode connected to the QB node and an output electrode connected to the first stage second carry output terminal CBT, an eighth transistor T8 including a control electrode connected to the Q2 node, an input electrode receiving the high power voltage VGH and an output electrode connected to the QB node, a first capacitor C1 including a first end receiving the high power voltage VGH and a second end connected to the QB node, and a fourth capacitor C4 including a first end receiving the second clock signal CLK2 and a second end connected to the Q1 node.

As shown in FIG. 13, the first clock signal CLK1 has low pulses in first, third, fifth and seventh durations DU1, DU3, DU5 and DU7 and the second clock signal CLK2 has low pulses in second, fourth and sixth durations DU2, DU4 and DU6.

A voltage of the Q1 node may rise at a falling edge of the first clock signal CLK1 in the first duration DU1, may fall to a first low level at a falling edge of the first clock signal CLK1 in the fifth duration DU5 after the vertical start signal VS falls to a low level, and may fall to a second low level at a falling edge of the second clock signal CLK2 in the sixth duration DU6. After the seventh duration DU7, the voltage of the Q1 node may rise to the first low level when the second clock signal CLK2 rises and the voltage of the Q1 node may fall to the second low level when the second clock signal CLK2 falls.

A voltage of the QB node may fall to a low level at a falling edge of the second clock signal CLK2 in the second duration DU2. The voltage of the QB node may rise to a high level at a falling edge of the first clock signal CLK1 in the fifth duration DU5.

The gate output signal OUT may rise to a high level at a falling edge of the second clock signal CLK2 in the second duration DU2. The gate output signal OUT slightly decreases at a falling edge of the first clock signal CLK1 in the fifth duration DU5 and falls to a low level at a falling edge of the second clock signal CLK2 in the sixth duration DU6.

According to the present embodiment, the gate driver 300 includes the carry signal generating circuit CARRY SIGNAL GENERATOR including the output buffer 310A, the first carry generator 320A and the second carry generator 330A, and the shift register circuit SHIFT REGISTER including the output buffer 310B, the first carry generator 320B and the second carry generator 330B. The shift register circuit SHIFT REGISTER operates based on the first carry signal CR[0] and the second carry signal CRB[0] generated by the carry signal generating circuit CARRY SIGNAL GENERATOR so that the gate driver 300 may stably output the gate signal.

Thus, the stability and the reliability of the gate driver 300 may be enhanced and the display quality of the display panel 100 may be enhanced.

According to the display apparatus of the present inventive concept as explained above, the stability and the reliability of the gate driver may be enhanced and the display quality of the display panel may be enhanced.

The foregoing is illustrative of the present inventive concept and is not to be construed as limiting thereof. Although a few embodiments of the present inventive concept have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific embodiments disclosed, and that modifications to the disclosed embodiments, as well as other embodiments, are intended to be included within the scope of the appended claims. The present inventive concept is defined by the following claims, with equivalents of the claims to be included therein.

What is claimed is:

1. A gate driver comprising:
a carry signal generating circuit configured to receive a vertical start signal and output a first carry signal and a second carry signal; and
a shift register circuit configured to receive the first carry signal and the second carry signal and output a first stage first carry signal, a first stage second carry signal and a first stage gate output signal,
wherein the carry signal generating circuit comprises a first carry generator configured to generate the first carry signal and a second carry generator configured to generate the second carry signal,
wherein the shift register circuit comprises a first stage first carry generator configured to generate the first stage first carry signal, a first stage second carry generator configured to generate the first stage second carry signal and a first stage output buffer configured to output the first stage gate output signal, and
wherein the second carry generator comprises:
a seventh transistor including a control electrode connected to a third node, an input electrode configured to receive a second clock signal and an output electrode connected to a second carry output terminal,
an eleventh transistor including a control electrode configured to receive a low power voltage, an input electrode connected to a first node and an output electrode connected to the third node, and
a second capacitor including a first end connected to the third node and a second end connected to the second carry output terminal.

2. The gate driver of claim 1, wherein a connection between transistors of the carry signal generating circuit is different from a connection between transistors of the shift register circuit.

3. The gate driver of claim 1, wherein the carry signal generating circuit further comprises an output buffer comprising:
a ninth transistor including a control electrode connected to a QB node, an input electrode configured to receive a high power voltage and an output electrode connected to an output terminal; and
a tenth transistor including a control electrode connected to a Q1 node, an input electrode configured to receive the low power voltage and an output electrode connected to the output terminal.

4. The gate driver of claim 3, wherein the first carry generator comprises:
a fourteenth transistor including a control electrode connected to the QB node, an input electrode configured to receive the high power voltage and an output electrode connected to a first carry output terminal; and
a fifteenth transistor including a control electrode connected to the Q1 node, an input electrode configured to receive the low power voltage and an output electrode connected to the first carry output terminal.

5. The gate driver of claim 1, wherein the carry signal generating circuit further comprises:
a first transistor including a control electrode configured to receive a first clock signal, an input electrode configured to receive the vertical start signal and an output electrode connected to a Q2 node;
a second transistor including a control electrode connected to a first node, an input electrode configured to receive a high power voltage and an output electrode connected to a second node;

a third transistor including a control electrode connected to a Q1 node, an input electrode configured to receive the second clock signal and an output electrode connected to the second node;

a fourth transistor including a control electrode connected to the Q2 node, an input electrode configured to receive the first clock signal and an output electrode connected to the first node;

a fifth transistor including a control electrode configured to receive the first clock signal, an input electrode configured to receive the low power voltage and an output electrode connected to the first node; and a third capacitor including a first end connected to the Q1 node and a second end connected to the second node.

6. The gate driver of claim 5, wherein the carry signal generating circuit further comprises:

a sixth transistor including a control electrode configured to receive the second clock signal, an input electrode connected to a QB node and an output electrode connected to the second carry output terminal;

an eighth transistor including a control electrode connected to the Q2 node, an input electrode configured to receive the high power voltage and an output electrode connected to the QB node; and a first capacitor including a first end configured to receive the high power voltage and a second end connected to the QB node.

7. The gate driver of claim 6, wherein the carry signal generating circuit further comprises:

a twelfth transistor including a control electrode configured to receive the low power voltage, an input electrode connected to the Q2 node and an output electrode connected to the Q1 node.

8. The gate driver of claim 6, wherein the carry signal generating circuit further comprises:

a thirteenth transistor including a control electrode configured to receive a reset signal, an input electrode configured to receive the high power voltage and an output electrode connected to the Q2 node.

9. The gate driver of claim 1, the carry signal generating circuit further comprises:

a first transistor including a control electrode configured to receive a first clock signal, an input electrode configured to receive the vertical start signal and an output electrode connected to a Q2 node;

a second transistor including a control electrode connected to a first node, an input electrode configured to receive a high power voltage and an output electrode connected to a second node;

a third transistor including a control electrode configured to receive the second clock signal, an input electrode connected to the second node and an output electrode connected to the Q2 node;

a fourth transistor including a control electrode connected to the Q2 node, an input electrode configured to receive the first clock signal and an output electrode connected to the first node; and a fifth transistor including a control electrode configured to receive the first clock signal, an input electrode configured to receive the low power voltage and an output electrode connected to the first node.

10. The gate driver of claim 9, the carry signal generating circuit further comprises:

a sixth transistor including a control electrode configured to receive the second clock signal, an input electrode connected to a QB node and an output electrode connected to the second carry output terminal;

an eighth transistor including a control electrode connected to the Q2 node, an input electrode configured to receive the high power voltage and an output electrode connected to the QB node;

a first capacitor including a first end configured to receive the high power voltage and a second end connected to the QB node; and a fourth capacitor including a first end configured to receive the second clock signal and a second end connected to the Q1 node.

11. The gate driver of claim 1, wherein the first stage output buffer comprises:

a ninth transistor including a control electrode connected to a QB node, an input electrode configured to receive a high power voltage and an output electrode connected to a first stage output terminal; and a tenth transistor including a control electrode connected to a Q1 node, an input electrode configured to receive the low power voltage and an output electrode connected to the first stage output terminal.

12. The gate driver of claim 11, wherein the first stage first carry generator comprises:

a fourteenth transistor including a control electrode connected to the QB node, an input electrode configured to receive the high power voltage and an output electrode connected to a first stage first carry output terminal; and a fifteenth transistor including a control electrode connected to the Q1 node, an input electrode configured to receive the low power voltage and an output electrode connected to the first stage first carry output terminal.

13. The gate driver of claim 1, wherein the first stage second carry generator comprises:

the seventh transistor including the control electrode connected to the third node, the input electrode configured to receive the second clock signal and the output electrode connected to a first stage second carry output terminal;

the eleventh transistor including the control electrode configured to receive the low power voltage, the input electrode connected to the first node and the output electrode connected to the third node; and the second capacitor including the first end connected to the third node and the second end connected to the first stage second carry output terminal.

14. The gate driver of claim 1, wherein the shift register circuit further comprises:

a first transistor including a control electrode configured to receive a first clock signal, an input electrode configured to receive the first carry signal and an output electrode connected to a Q2 node;

a second transistor including a control electrode connected to a first node, an input electrode configured to receive a high power voltage and an output electrode connected to a second node;

a third transistor including a control electrode connected to a Q1 node, an input electrode configured to receive the second clock signal and an output electrode connected to the second node;

a fourth transistor including a control electrode configured to receive the first clock signal, an input electrode configured to receive the second carry signal and an output electrode connected to the first node; and a third capacitor including a first end connected to the Q1 node and a second end connected to the second node.

15. The gate driver of claim 14, wherein the shift register circuit further comprises:
a sixth transistor including a control electrode configured to receive the second clock signal, an input electrode connected to a QB node and an output electrode connected to a first stage second carry output terminal;
an eighth transistor including a control electrode connected to the Q2 node, an input electrode configured to receive the high power voltage and an output electrode connected to the QB node; and
a first capacitor including a first end configured to receive the high power voltage and a second end connected to the QB node.

16. The gate driver of claim 15, wherein the shift register circuit further comprises:
a twelfth transistor including a control electrode configured to receive the low power voltage, an input electrode connected to the Q2 node and an output electrode connected to the Q1 node.

17. The gate driver of claim 15, wherein the shift register circuit further comprises:
a thirteenth transistor including a control electrode configured to receive a reset signal, an input electrode configured to receive the high power voltage and an output electrode connected to the Q2 node; and
a sixteenth transistor including a control electrode configured to receive the reset signal, an input electrode configured to receive the reset signal and an output electrode connected to the QB node.

18. The gate driver of claim 1, wherein the shift register circuit further comprises:
a seventeenth transistor including a control electrode configured to receive a first clock signal, an input electrode configured to receive the first carry signal and an output electrode connected to a fourth node; and
an eighteenth transistor including a control electrode configured to receive the low power voltage, an input electrode connected to the fourth node and an output electrode connected to a fifth node.

19. The gate driver of claim 18, wherein the shift register circuit further comprises:
a nineteenth transistor including a control electrode connected to the fifth node, an input electrode connected to the fifth node and an output electrode connected to a Q1 node.

20. The gate driver of claim 1, wherein the shift register circuit further comprises:
a first transistor including a control electrode configured to receive a first clock signal, an input electrode configured to receive the first carry signal and an output electrode connected to a Q2 node;
a second transistor including a control electrode connected to a first node, an input electrode configured to receive a high power voltage and an output electrode connected to a second node;
a third transistor including a control electrode configured to receive the second clock signal, an input electrode connected to the second node and an output electrode connected to the Q2 node; and
a fourth transistor including a control electrode configured to receive the first clock signal, an input electrode configured to receive the second carry signal and an output electrode connected to the first node.

21. The gate driver of claim 20, wherein the shift register circuit further comprises:
a sixth transistor including a control electrode configured to receive the second clock signal, an input electrode connected to a QB node and an output electrode connected to a first stage second carry output terminal;
an eighth transistor including a control electrode connected to the Q2 node, an input electrode configured to receive the high power voltage and an output electrode connected to the QB node;
a first capacitor including a first end configured to receive the high power voltage and a second end connected to the QB node; and
a fourth capacitor including a first end receiving the second clock signal and a second end connected to the Q1 node.

22. A display apparatus comprising:
a display panel including a pixel;
a gate driver configured to provide a gate signal to the pixel;
a data driver configured to provide a data voltage to the pixel; and
an emission driver configured to provide an emission signal to the pixel,
wherein the gate driver comprises:
a carry signal generating circuit configured to receive a vertical start signal and output a first carry signal and a second carry signal; and
a shift register circuit configured to receive the first carry signal and the second carry signal and output a first stage first carry signal, a first stage second carry signal and a first stage gate output signal,
wherein the carry signal generating circuit comprises a first carry generator configured to generate the first carry signal and a second carry generator configured to generate the second carry signal,
wherein the shift register circuit comprises a first stage first carry generator configured to generate the first stage first carry signal, a first stage second carry generator configured to generate the first stage second carry signal and a first stage output buffer configured to output the first stage gate output signal, and
wherein the second carry generator comprises:
a seventh transistor including a control electrode connected to a third node, an input electrode configured to receive a second clock signal and an output electrode connected to a second carry output terminal,
an eleventh transistor including a control electrode configured to receive a low power voltage, an input electrode connected to a first node and an output electrode connected to the third node, and
a second capacitor including a first end connected to the third node and a second end connected to the second carry output terminal.

23. A gate driver comprising:
a carry signal generating circuit configured to receive a vertical start signal and output a first carry signal and a second carry signal; and
a shift register circuit configured to receive the first carry signal and the second carry signal and output a first stage first carry signal, a first stage second carry signal and a first stage gate output signal,
wherein the carry signal generating circuit comprises a first carry generator configured to generate the first carry signal and a second carry generator configured to generate the second carry signal,
wherein the shift register circuit comprises a first stage first carry generator configured to generate the first stage first carry signal, a first stage second carry generator configured to generate the first stage second carry signal and a first stage output buffer configured to output the first stage gate output signal, and wherein the carry signal generating circuit further comprises:

a seventeenth transistor including a control electrode configured to receive a first clock signal, an input electrode configured to receive the vertical start signal and an output electrode connected to a fourth node, and an eighteenth transistor including a control electrode configured to receive a low power voltage, an input electrode connected to the fourth node and an output electrode connected to a fifth node.

24. The gate driver of claim 23, wherein the carry signal generating circuit further comprises:

a nineteenth transistor including a control electrode connected to the fifth node, an input electrode connected to the fifth node and an output electrode connected to a Q1 node.

* * * * *